United States Patent [19]

Girard

[11] 4,403,308

[45] Sep. 6, 1983

[54] APPARATUS FOR AND METHOD OF REFRESHING MOS MEMORY

[75] Inventor: Paul M. Girard, Versailles, France

[73] Assignee: CII Honeywell Bull, Paris, France

[21] Appl. No.: 226,245

[22] Filed: Jan. 19, 1981

[30] Foreign Application Priority Data

Jan. 17, 1980 [FR] France ............................ 80 01031

[51] Int. Cl.³ .............................................. G11C 7/00
[52] U.S. Cl. ................................................. 365/222
[58] Field of Search ...................................... 365/222

[56]  References Cited

U.S. PATENT DOCUMENTS

| 3,737,879 | 6/1973 | Greene et al. |  |
|---|---|---|---|
| 3,760,379 | 9/1973 | Nibby et al. | 365/222 |
| 3,800,295 | 3/1974 | Anderson, Jr. et al. |  |
| 3,811,117 | 5/1974 | Anderson, Jr. et al. |  |
| 4,040,122 | 8/1977 | Bodin |  |
| 4,106,108 | 4/1978 | Cislaghi et al. |  |
| 4,133,051 | 1/1979 | Gentili |  |
| 4,158,883 | 6/1979 | Kadono et al. |  |
| 4,172,282 | 10/1979 | Aichelmann et al. | 365/222 |
| 4,185,323 | 1/1980 | Johnson et al. |  |
| 4,238,842 | 12/1980 | Aichelmann | 365/222 |

FOREIGN PATENT DOCUMENTS 2264166 7/1973 Fed. Rep. of Germany ...... 365/222
2431749 7/1979 France .

OTHER PUBLICATIONS

Electronics, vol. 52, No. 4, 2/15/79; pp. 141–147.
Semiconductor Memory Handbook, Intel. 1978 139–181.
Electronic Design, vol. 27, No. 13; 6/21/79; pp. 58–64.
Electronic Design, vol. 26, No. 26; 12/20/78; pp. 72–76.

Primary Examiner—Stuart N. Hecker
Attorney, Agent, or Firm—Lowe, King, Price & Becker

[57]  ABSTRACT

A random access memory requiring refreshing is refreshed during refresh phases of operating cycles of the memory including write or read phases, i.e., useful phases. A selection phase is initiated currently with a useful phase at the beginning of each cycle. During the selection phase, a determination is made as to whether the memory is to enter a refresh phase during the cycle. In response to the determination during the selection phase indicating that the memory is to enter the refresh phase, the refresh phase in initiated. In one embodiment, the useful phase is terminated before the refresh phase starts. In a second embodiment, the useful phase is completed even though a refresh phase is selected, and then the refresh phase is executed.

25 Claims, 25 Drawing Figures

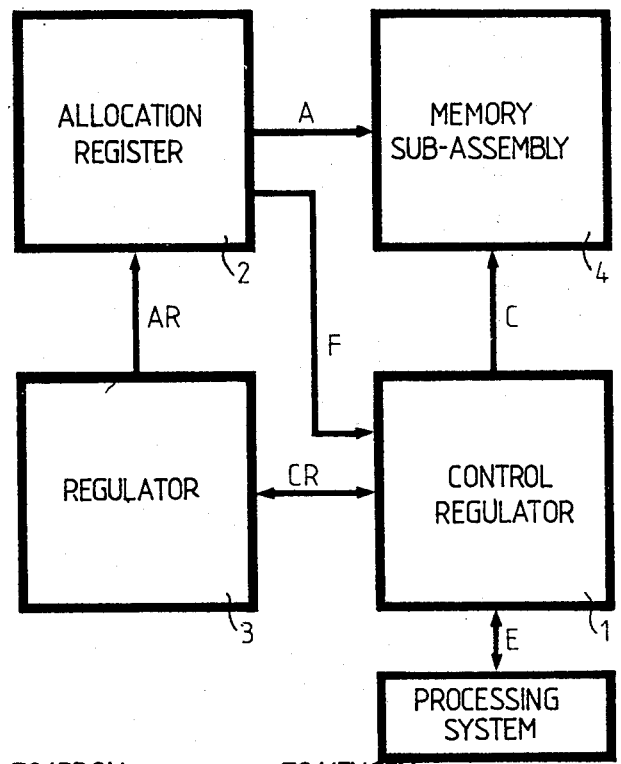
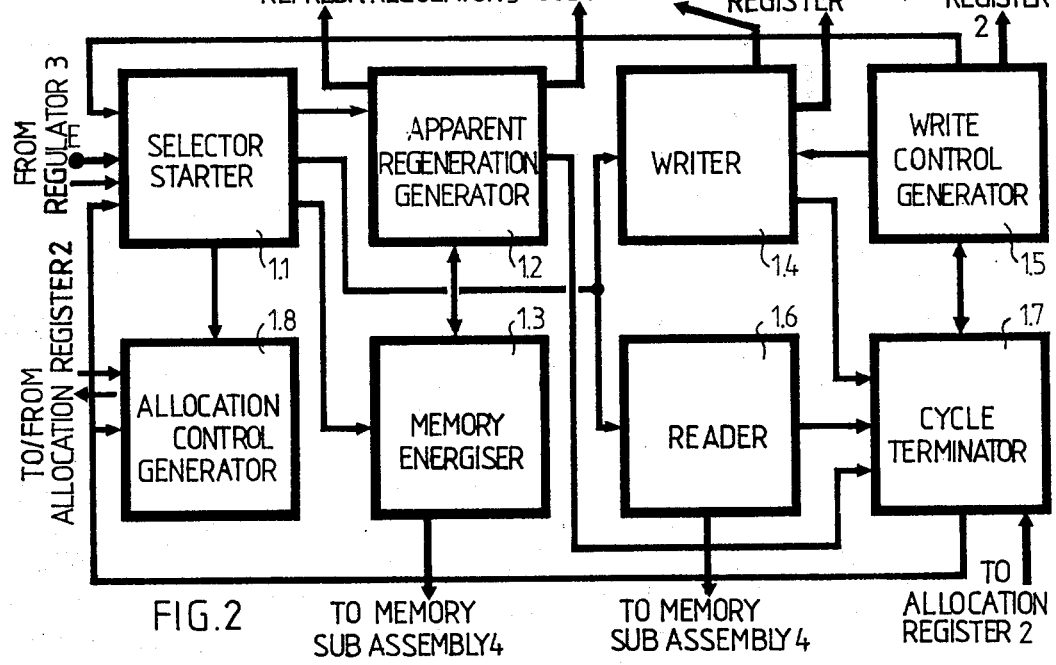

APPARATUS FOR AND METHOD OF REFRESHING MOS MEMORY

TECHNICAL FIELD

The present invention relates generally to a method of and apparatus for regenerating or refreshing a metal oxide semi-conductor (MOS) memory of a data processing system, and more particularly to such a method and apparatus wherein selection and execution phases of each cycle are simultaneously executed at the beginning of each cycle.

BACKGROUND ART

Metal oxide semi-conductor circuits are extensively utilized as memories in data processing systems. In dynamic MOS memories, data are stored as quantities of charge in parasitic capacitors between a gate and drain electrode of an MOS field effect transistor (FET). Because the parasitic capacitor has substantial leakage, it is necessary to combine the capacitor with a device for recharging the capacitor periodically to preserve the stored data value, such recharging is generally referred to as a refresh operation. The refresh operation is performed typically under the control of a data processing system of which the memory is a part.

The memory is controlled by the data processing system so that the memory is operating either in a refresh cycle or in a useful cycle. During a refresh cycle, charge is restored to the parasitic capacitors. During a useful cycle, the data processing system of which the memory is a part, has access to the memory so that stored data are exchanged between the memory and the data processor, whereby elementary data processing operations can be performed by the data processing system during the useful cycles. In contrast, during the regeneration or refresh cycles, the data processing system does not have access to data stored in the memory. It is thus important to minimize the total time that the memory is being refreshed. Generally, calls for useful and refresh cycles of the memory by the data processing system are assynchronous, and the data processing system must constantly resynchronize the useful and refresh cycles in order to select them.

In one prior art system, a selective decision is made at the beginning of each useful or refresh cycle. In the prior art system, the period required for a selective decision at the beginning of each cycle is approximately several hundred nanoseconds. The selective decision period is followed by approximately twenty (20) nanoseconds, during which addressing circuit switching and preparation operations are performed. A random access, MOS dynamic memory is thus unavailable to the remainder of a data processing system of which it is a part for an interval of approximately one hundred and twenty (120) nanoseconds during each cycle, before a useful or refresh cycle is actually initiated. The unavailability of the memory to the data processing system is increased during elementary operations wherein data are read from a memory block or cell, since the time required to acquire the data is systematically prolonged by the selection time; the time required to acquire the information is frequently referred to as the data access time.

It is, accordingly, an object of the present invention to provide a new and improved method and apparatus for reducing the total cycle time in a refresh, MOS, random access memory.

A further object of the invention is to provide a new and improved apparatus for and method of refreshing an MOS, random access, dynamic memory wherein data selection intervals are not systematically added to cycle time of the memory.

An additional object of the present invention is to provide a new and improved apparatus for and method of operating a random access, dynamic MOS memory wherein data access time is reduced by the period required for selection of a refresh or useful cycle.

THE INVENTION

In accordance with the present invention, a random access, MOS, dynamic memory that must be refreshed is simultaneously triggered into selection and execution phases during a useful cycle, at the start of each cycle. In accordance with one configuration of the invention the execution phase of a useful cycle is selectively interrupted at the end of the selection phase if a refresh operation has been selected during the selection phase. After the selection phase indicating that a refresh operation is to be performed, the refresh operation is carried out. If, during the selection phase it is indicated that a useful cycle is to be performed, the useful cycle is continued.

In accordance with another configuration of the invention, there is simultaneous triggering of the selection and execution phases at the beginning of each useful cycle, after which the useful cycle is executed. If a refresh operation is selected during execution of the useful cycle, a refresh cycle follows the executed useful cycle.

The above and still further objects, features and advantages of the present invention will become apparent upon consideration of the following detailed description of the several specific embodiments thereof, especially when taken conjunction with the accompanying drawings.

BRIEF DESCRIPTION OF THE DRAWING

FIG. 1 is a block diagram of a dynamic, random access (RAM) refresh memory system in accordance with a preferred embodiment of the invention;

FIG. 2 is a block diagram of a control regulator utilized in the system of FIG. 1;

BEST MODE FOR CARRYING OUT THE INVENTION

Figure 22:
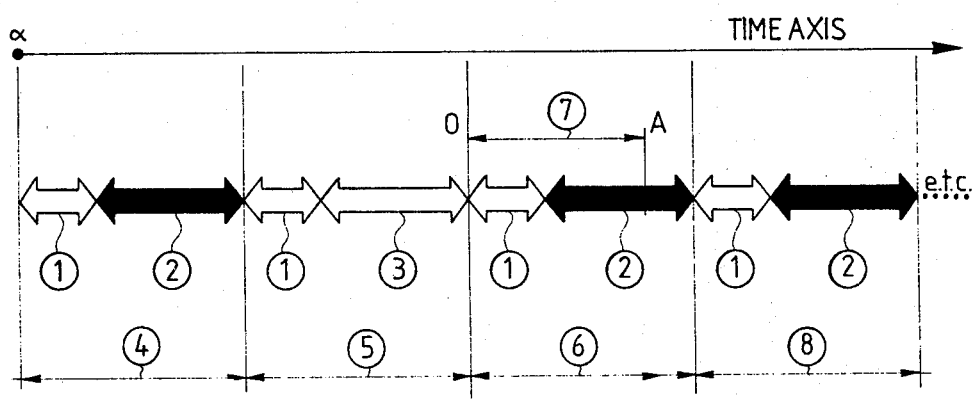
FIG. 22 is a cycle time distribution diagram in accordance with the prior art.
Figure 23:
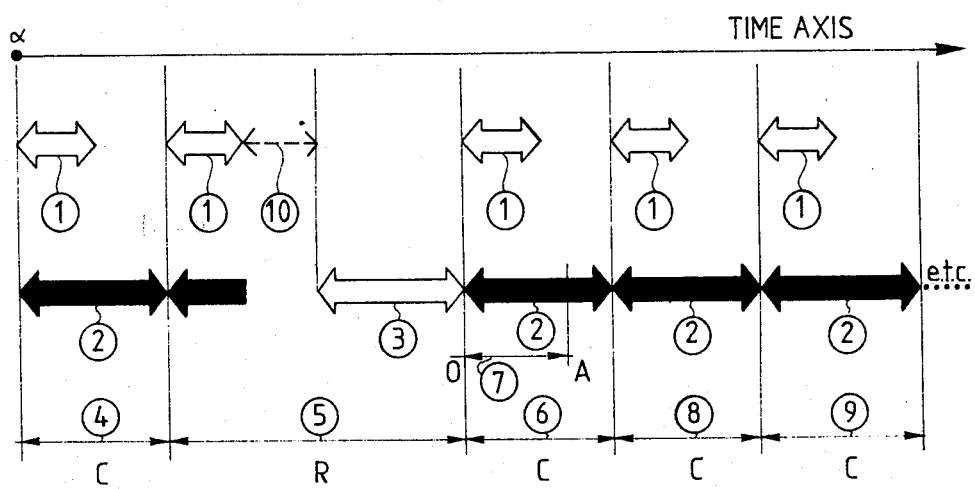
FIG. 23 is a cycle time distribution diagram in accordance with one aspect of the present invention wherein binary selection is employed.
Figure 24:
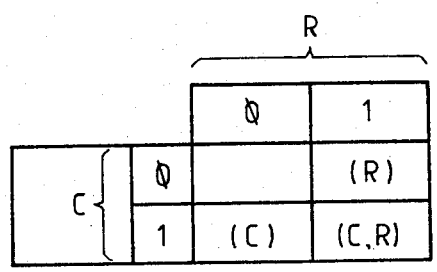
FIG. 24 is a truth table specifying a ternary selection mode in accordance with the invention.
Figure 25:
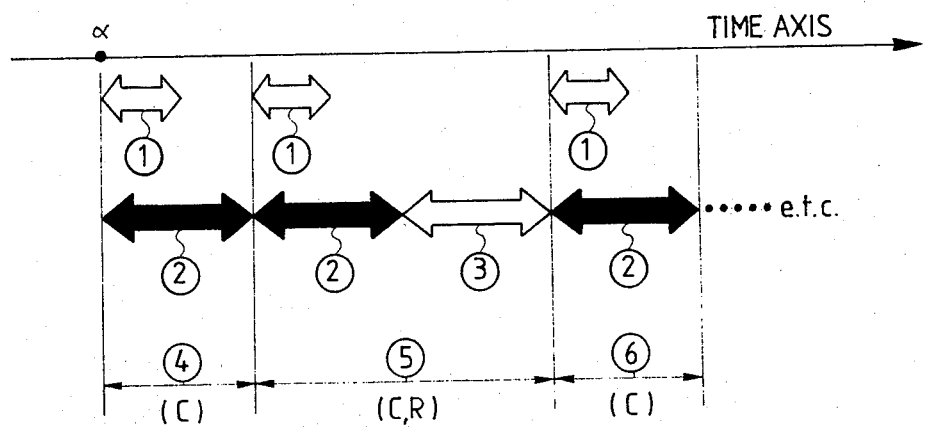
FIG. 25 is a cycle time distribution diagram of a ternary selection mode in accordance with the invention.

Before describing the apparatus of the invention in detail, consideration is given to the cycle time distribution diagrams of FIGS. 22, 23 and 25, as well as the truth table of FIG. 24. Consideration of these Figures enables the method of the present invention to be appreciated, facilitates the description of the apparatus utilized to perform the method, and indicates the advantages of the present invention over a prior art system.

Reference is now made to the prior art cycle time distribution diagram of FIG. 22 which includes useful time intervals, 4, 6 and 8, as well as regeneration or refresh cycle 5. Each of cycles 4, 5, 6, and 8 includes a relatively short select interval or phase (1) at the beginning of the cycle period. During select interval 1 a decision is made as to whether a particular cycle is a useful or refresh cycle. During useful cycles 4, 6 and 8, select interval 1 is followed by a longer interval or phase 2 during which a random access, dynamic, refresh MOS memory is exchanging information with a data processing system, of which the memory is a part. During intervals 2 data may be written into or read from the memory. However, during a refresh cycle, select phase 1 is followed by a refresh implementation phase 3, having approximately the same duration as each of phases 2 of cycles 4, 6, and 8. During cycle 6, data are read from the memory during an interval indicated by arrow 7, between times O and A. In the interval indicated by arrow 7, defined as a data access phase, data are read from the memory. Thus, in the prior art system, the selection intervals 1 are systematically added during each cycle period, to the intervals 2 or 3, whereby the access time is extended by a selection period 1.

In accordance with the present invention, a separate selection period 1 at the beginning of each useful cycle is omitted, whereby the total time required for operation of the memory is reduced, because the length of each useful cycle is considerably less than the length of useful cycles in the prior art.

The method of the present invention in accordance with one embodiment is illustrated in the cycle time diagram of FIG. 23. The cycle time diagram of FIG. 23 is applicable to "binary selection" methods. The method performed in accordance with FIG. 23 is considered to be a binary selection method because at the end of each selection phase 1, a useful phase 2 which began simultaneously with the selection phase 1, continues, or a refresh phase 3 is executed.

In FIG. 23, useful cycles (C) 4, 6, 8, and 9 include a selection phase 1 which starts simultaneously with a cycle execution phase 2. During each of cycles 4, 6, 8, and 9, execution phase 2 is completely performed everytime because during selection phase 1 a determination is made that the particular cycle is a useful cycle. Because the selection phases 1 and the useful phases 2 start concurrently and are simultaneously performed, the duration of each useful cycle is considerably reduced, whereby the number of useful cycles per unit length of time considerably increases, enabling the output of the memory to be appreciably improved. In addition, data access periods 7, indicated by interval between times O and A during useful cycle 6, is reduced in accordance with the method of FIG. 23, compared to the similar access period 7 in the prior art system illustrated in FIG. 22.

Refresh cycle 5 in FIG. 23 is slightly longer than refresh cycle 5 in the prior art method as indicated by FIG. 22. If, during select phase 1, it is determined that a refresh cycle is necessary, certain operations which are necessary to perform the refresh phase are executed during a "blank" phase 10. Upon completion of blank phase 10, refresh phase 3 is executed; upon completion of refresh phase 3, refresh cycle 5 is completed and useful cycle 6 begins. The increase in the duration of refresh cycle R, in the method of FIG. 23, occasioned by the inclusion of blank phase 10, compared to the prior art refresh cycle wherein refresh phase 3 immediately follows after selection phase 1, has only a slight increase in the refresh cycle time. However, the total proportion of the number of refresh cycles to the total number of cycles and the time requirements of the refresh cycles to the total operating time of the memory is relatively low, only a few percent. Thereby operating time of the memory to execute a complete sequence of useful and refresh cycles is considerably reduced in accordance with the present invention.

The increased length of refresh cycles relying on the binary selection process can be decreased to the same length as refresh cycles of the prior art, by utilizing a ternary selection process. In the ternary selection process, blank phase 10 required in the binary selection process illustrated in FIG. 23 is completely removed, and refresh phase 3 follows immediately after selection phase 2, which is instigated at the beginning of a refresh cycle simultaneously with selection phase 1, as illustrated in FIG. 25 by ternary refresh cycle (C,R) 5. During the ternary refresh cycle, the operations which are performed during blank phase 10, FIG. 23, are begun simultaneously with selection and useful phases 1 and 2.

Selection of a binary or ternary refresh cycle is performed with a pair of flipflops, instead of a single flipflop, as required for binary refresh cycles. To provide ternary selection, the states of the two flipflops are coded in accordance with the truth table of FIG. 24, wherein the state of a first flipflop C is indicated by rows 0 and 1 adjacent C in FIG. 24, while the state of a second flipflop R is indicated by the states of columns 0 and 1 adjacent R, FIG. 24. Both flipflops C and R cannot simultaneously be in the zero state to signify a ternary operation whereby the position in the truth table at C=0, R=0, is blank and is not significant. A useful cycle is indicated in the truth table of FIG. 24, as (C), and is indicated by flipflop C being set to a binary 1 state, while flipflop R is set to a binary 0 state. A binary refresh cycle R is indicated by flipflops C and R being respectively set to the binary zero and 1 states, while a ternary refresh cycle (C,R) is indicated by flipflops C and R both being activated to the binary 1 state. In the actual system there is a very low probability of a binary refresh cycle being employed unless the MOS, random access refresh memory is being under utilized considerably, whereby the time loss occasioned by the use of a binary refresh cycle (R) as illustrated in FIG. 23 is not important.

As illustrated in FIG. 25, a ternary refresh cycle (C,R) 5 occurs in the following sequence: Selection phase 1 begins simultaneously with execution of useful phase 2 as refresh cycle 5 begins. At the time phase 2 has been completely executed, a determination has been made as to whether or not the memory must be refreshed. Thereby, refresh phase 3 is executed before the control elements associated with cycle 5 are reset or released and before another cycle 6 is executed. In executing refresh cycle 5, the decrease in the output rate of the memory is limited to the very small time loss required for execution of the single refresh phase 3. Thus, with ternary selection there is a further reduction of the time loss caused by refreshing the memory, and consequently an improvement in the output rate of the memory.

Reference is now made to FIG. 1 of the drawing, a block diagram of a system including a MOS refreshed, random access memory system in accordance with the present invention. The memory system of the present invention includes a control regulator 1 that exchanges signals in both directions with the remainder of a data processing system of which the memory system is a part. Control regulator 1 supplies control signals C to storage sub-assembly 4, which is the MOS, random access, dynamic memory requiring refreshing. Storage sub-assembly 4 is supplied with address signals A for memory locations within the storage sub-assembly by allocation of register 2. Allocation register 2 also supplies function indicating signals F to control regulator 1. Regeneration or refresh regulator 3 exchanges mode signals (C,R) for ternary refresh cycles and for useful cycles with control regulator 1. Refresh regulator 3 also supplies signals AR to allocation register 2, which signals are indicative of addresses in storage sub-assembly which are to be refreshed.

Before describing the system in detail, a description of the nomenclature utilized in the Figures is in order. The subsystems employed in the various blocks of FIG. 1 have a first digit which designates the subsystem followed by a decimal point. Components within subsystems include a first digit in accordance with the block of which they are a part; the first digit is followed by a decimal point, in turn followed by the numeral associated with the subsystem in which the component is located. The component is designated by a two digit number which follows the digit immediately after the decimal point. Thus, control regulator 1 includes a selector starter subsystem 1.1 having an OR gate 1.105. Input signals from a particular subsystem to another subsystem are designated by reference numerals associated with the subsystem from which the signal originates. Signals coupled from one subsystem to another are designated on the diagram for the subsystems with the subsystem to which the subsystem is coupled.

Figure 14:
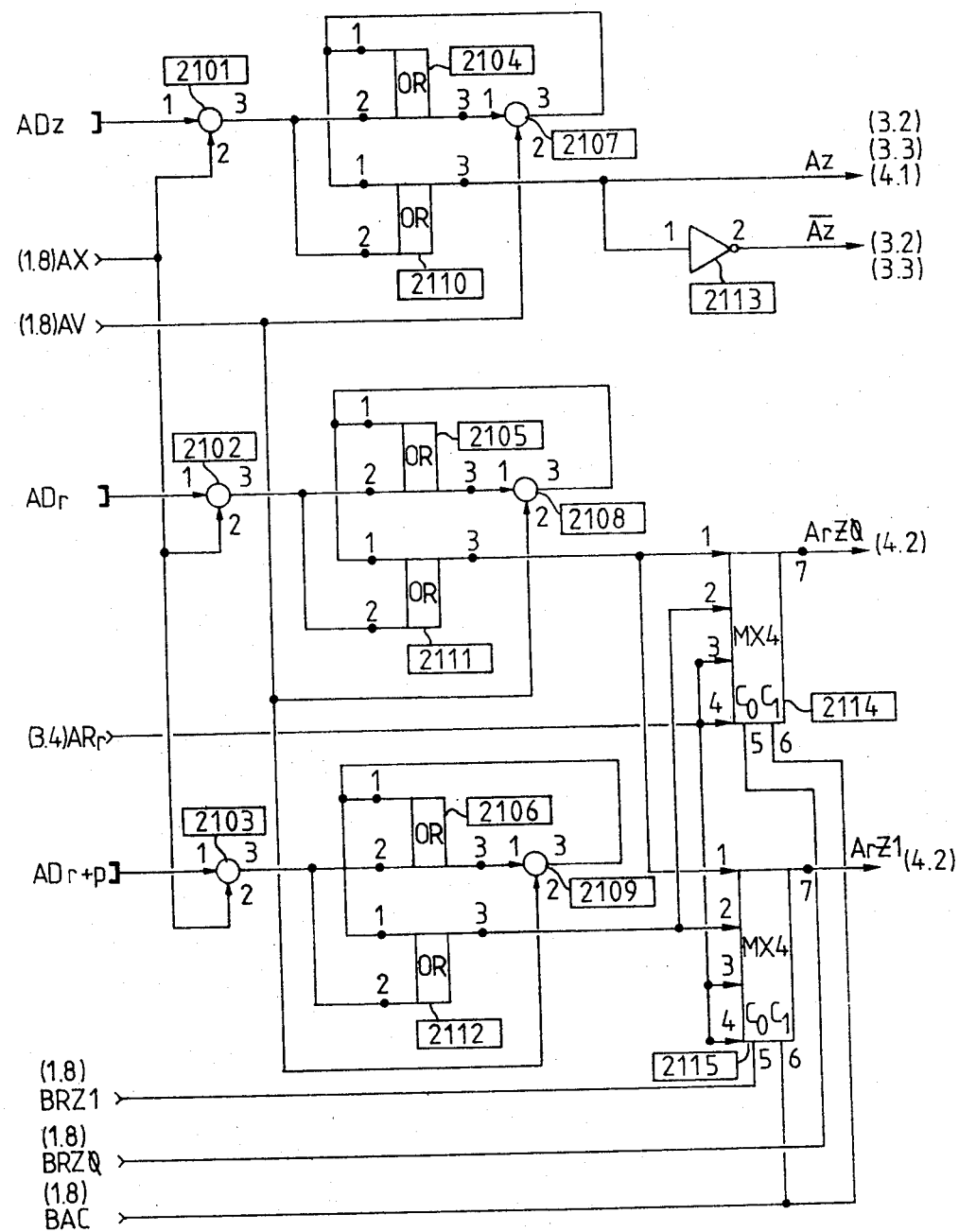
FIG. 14 is a detailed block diagram of an address register utilized in the allocation register of FIG. 3.

In the drawings, each square generally represents a data (D) flipflop having set input terminal 1, reset input terminal 2, clock input terminal 3, data input terminal 4, true output terminal 5, and complementary output terminal 6. Hollow circles generally designate AND gates, while rectangles having vertically extending bases are OR gates. Rectangles having horizontally extending bases are usually delay lines formed by a plurality of cascaded flipflop stages that are clocked by a timing source (not shown) in association with the delay lines. Other elements in the drawing having horizontally extending bases, in combination with a series resistance-capacitance circuit extending from the top of the rectangle represent monostable multivibrators. In FIG. 14, a pair of four (4) channel multiplexers are illustrated as rectangles having vertically extending bases.

Control regulator 1, FIG. 2, includes a selector-starter 1.1 which responds to signals from the remainder of the data processing system of which the memory of the present invention is a part, as well as signals from refresh regulator 3, to derive signals indicative of whether a particular cycle is a useful cycle, a binary refresh cycle or a ternary refresh cycle. In particular, the selector-starter 1.1 responds to calls for memory cycles as derived from the remainder of the data processing system and refresh calls as derived from refresh regulator 3. Depending upon these calls, selector-starter 1.1 triggers the operation of either apparent refresh generator 1.2 or writer 1.4 for memory sub-assembly 4, or for reader 1.6 for memory sub-assembly 4. Regardless of the decision made by selector-starter 1.1, it supplies a control signal to allocation control generator 1.8 and to memory energizer 1.3.

Apparent refresh generator 1.2 responds to the signal supplied to it by selector-starter 1.1 to trigger an apparent refresh cycle. Apparent refresh generator 1.2 also exchanges signals with memory energizer 1.3 for memory sub-assembly 4. When a refresh cycle is completed apparent refresh generator 1.2 supplies a signal which activates the end of cycle terminator 1.7.

Writer or write network 1.4 responds to signals supplied thereto to control writing actions of memory sub-assembly 4 as a function of the order in which signals are derived from write control generator 1.5. When a write operation has been completed, write network 1.4 supplies a signal to cycle terminator 1.7 whereby the cycle terminator derives a control signal to terminate further operation of selector starter 1.1., allocation control generator 1.8, and write control generator 1.5. Write control generator 1.5, in addition to exchanging signals with cycle terminator 1.7, supplies control signals to write network 1.4 and actuates selector-starter 1.1 for renewed starting of a memory cycle.

Reader or read network 1.6 derives control signals for triggering read operations in memory sub-assembly 4, before deriving a control signal to actuate cycle terminator 1.7, at the end of each read cycle. Cycle terminator 1.7 responds to signals indicative of the completion of different operations performed in the memory system of FIG. 1 and authorizes the beginning of new memory cycles. Allocation control generator 1.8 responds to signals from selector-starter 1.1 and cycle terminator 1.7, to exchange signals with allocation register 2.

Figure 3:
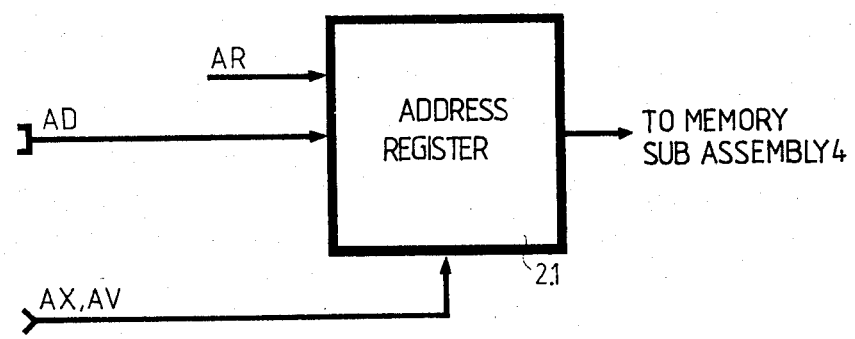
FIG. 3 is a block diagram of an allocation register utilized in the system of FIG. 1.

Allocation register 2, as illustrated in FIG. 3, is divided into address register 2.1 and function register 2.2. Address register 2.1 responds to address indicating signals AD, as derived from the remainder of the data processing system of which the memory system is a part. Address signals AD indicate the required location of memory sub-assembly 4 into which data are to be written, or from which data are to be read. Address register 2.1 is also responsive to signal AR, indicative of an address in memory sub-assembly 4 which is to be refreshed as derived from regeneration regulator 3. The addresses indicated by signals AD and AR are stored within register 2.1 for coupling into memory sub-assembly 4 under the control of signals AX and AV, derived from allocation control generator 1.8, FIG. 2.

Function register 2.2 stores a function indicating signal F, indicative of a function which is to be executed by control regulator 1. The storing of function signal F, by function register 2.2, is under the control of signals FX and FV, derived by allocation control generator 1.8, FIG. 2. The function signal F derived by function generator 2.2 is supplied to control regulator 1, FIG. 1, to indicate if a particular memory cycle of sub-assembly 4 is to be a read and/or write cycle.

Figure 4:
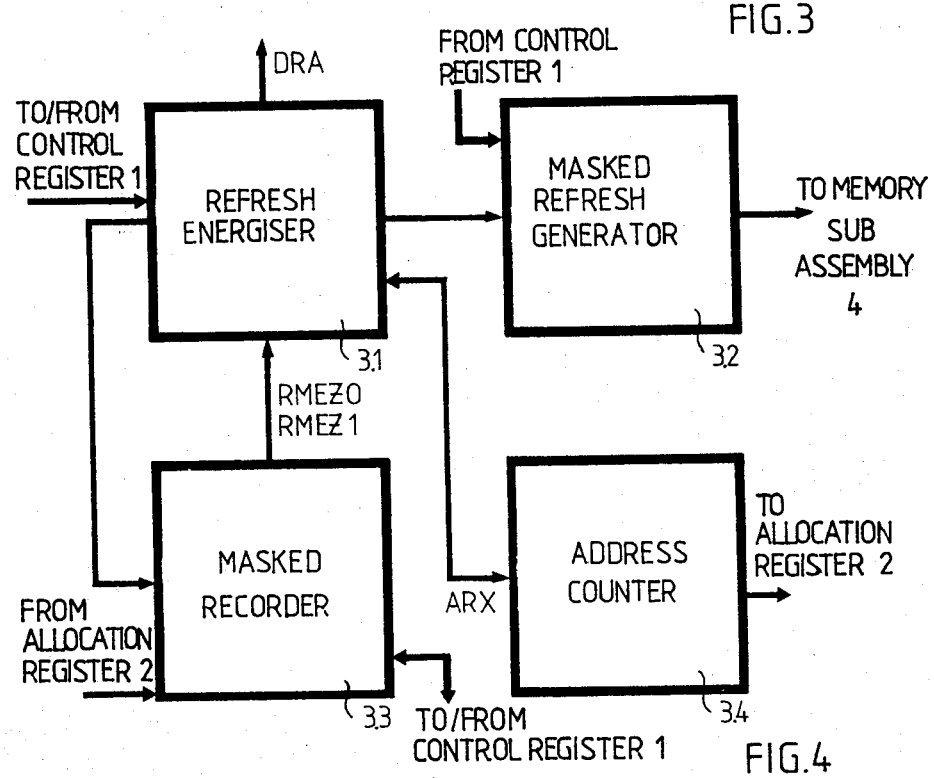
FIG. 4 is a block diagram of a regeneration or refresh regulator employed in the system of FIG. 1.

Refresh regulator 3 is divided into a refresh energizer 3.3, a masked refresh generator 3.2, a masked refresh recorder or storage element 3.3 and a refresh address counter 3.4, as illustrated in FIG. 4. Refresh energizer 3.1 determines which of the memory cells in memory sub-assembly 4 are masked during a particular refresh cycle and supplies a signal indicative of the cells to be masked to masked refresh generator 3.2 which controls execution of masked refresh cycles in memory sub-assembly 4. Refresh energizer 3.1 also derives an output signal that requests an apparent refresh signal DRA to be coupled to select starter 1.1, FIG. 2, when result indicating signals RMEZ0 and RMEZ1 derived by masked refresh recorder 3.3 are unsatisfactory. Refresh energizer 3.1 periodically derives signal ARM that is supplied to masked refresh generator 3.2.

Masked refresh recorder 3.3 responds to signals FRA and RMRZ indicating that the masked refresh cycles have been executed, derived from apparent refresh generator 1.2 and refresh energizer 3.1. Masked refresh recorder 3.3 stores these signals to enable them to be fed to refresh energizer 3.1 as signals RMEZ0 and RMEZ1. Refresh address counter 3.4 responds to refresh address signal ARX derived from refresh energizer 3.1, to derive a refresh address AR which is supplied to address register 2.1 of memory sub-assembly 4.

Figure 5:
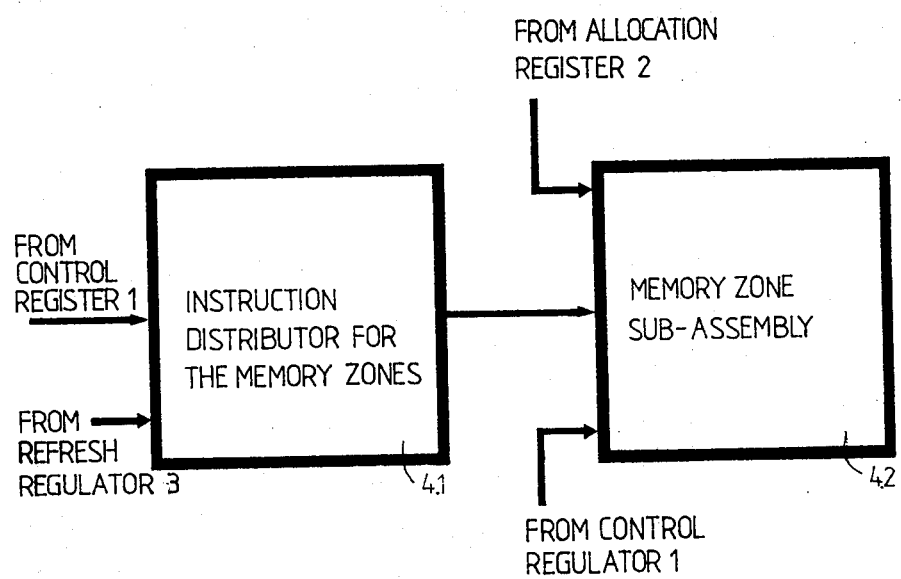
FIG. 5 is a block diagram of a storage assembly utilized in the system of FIG. 1.

Memory sub-assembly 4, as illustrated in FIG. 5, includes an instruction distributor 4.1 for a section of the memory sub-assembly as well as selection of one of a plurality of memory zones in sub-assembly section 4.2. Instruction distributor 4.1 supplies memory instruction signals from the remainder of the memory system illustrated in FIG. 1 to a plurality of memory sections included in section 4.2; in the described embodiment, two zones are included in section 4.2, but it is to be understood that more than two sections can be included in section 4.2. Memory section 4.2 is an MOS, random access refreshed memory in which charge is stored on parasitic capacitors between gate and drain electrodes of field effect transistors. Instruction distributor 4.1 is responsive to signals from control regulator 1 and from refresh regulator 3, to supply instruction signals to the memory zones in memory ensemble 4.2. The memory zones in ensemble 4.2 are also responsive to signals from control regulator 1 and address signals from allocation register 2.

Figure 6:
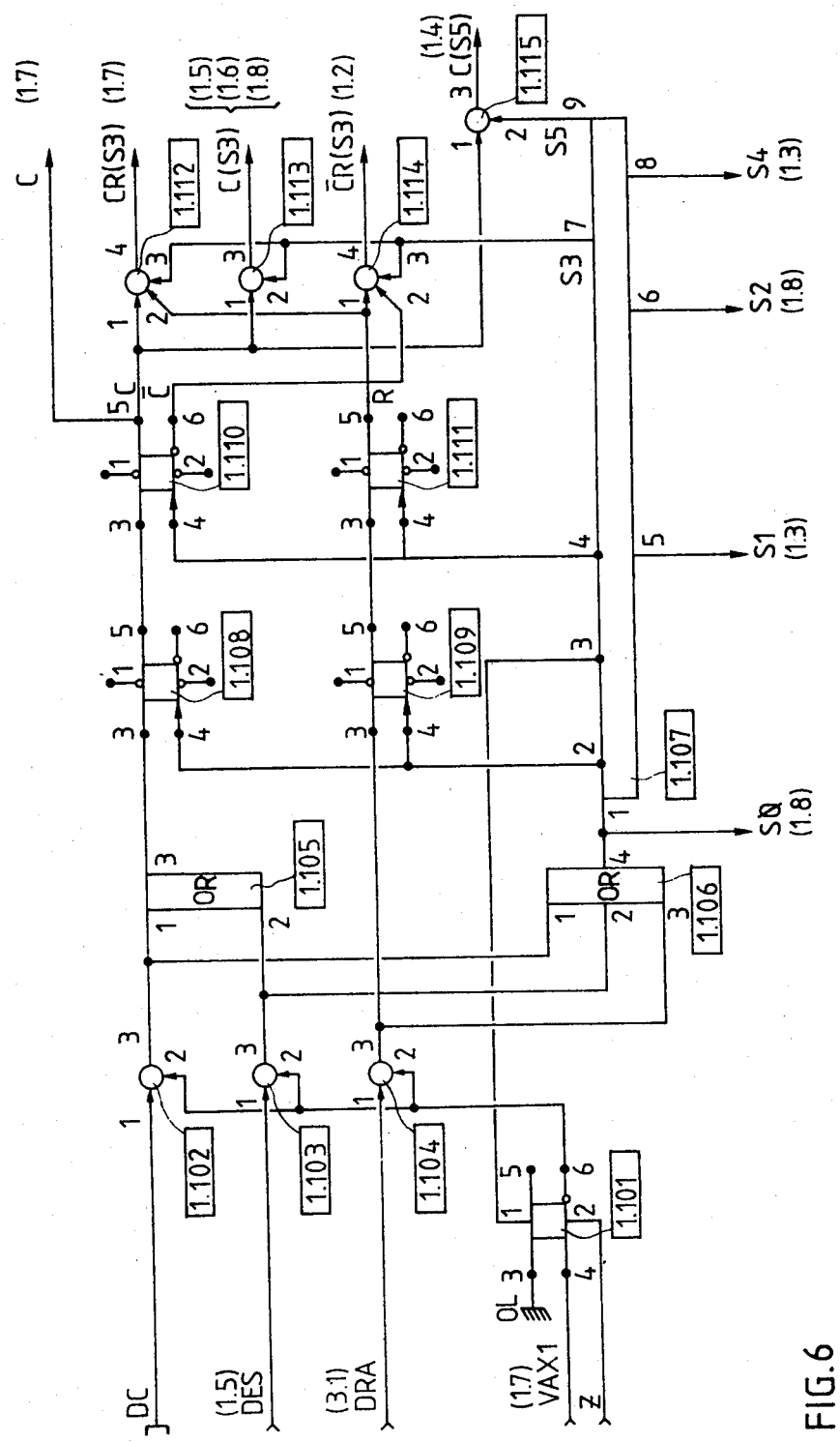
FIG. 6 is a detailed block diagram of one embodiment of a selector-starter employed in the control regulator of FIG. 2.

Reference is now made to FIG. 6 of the drawing wherein there is illustrated a detailed block diagram of selector-starter, 1.1, FIG. 2. Selector-starter 1.1 as illustrated in FIG. 6 is utilized in connection with memory sub-assembly 4 that is influenced only by useful and refresh requests. Signals DC and DES respectively derived from the remainder of the data processor of which the memory system is a part and write control generator 1.5 indicate that a useful cycle (read or write a data item into or from memory sub-assembly 4) is to be executed by the memory system. Signal DRA derived from regeneration energizer 3.1 indicates that a refresh cycle is to be executed by the memory system whereby capacitors in dynamic random access, metal oxide semiconductor, field effect transistor memory sub-assembly 4 are refreshed.

Signals DC, DES and DRA are respectively supplied to input terminals 1 of AND gates 1.102, 1.103, and 1.104, FIG. 6. Each of AND gates 1.102, 1.103, and 1.104 includes an input terminal 2 responsive to enabling signal derived from output terminal 6 of flipflop 1.101 in response to a positive going transition of signal VAX1 applied to input terminal 4 of the flipflop at the beginning of a useful or refresh cycle, by cycle terminator 1.7. Flipflop 1.101 also includes a reset input terminal 2 responsive to a general initializing signal Z, supplied to the memory sub-system by the data processing system of which the memory sub-system is a part, at the beginning of operation of the data processing system. Flipflop 1.101 includes a data input terminal 3 which is grounded.

Each of AND gates 1.102 and 1.103 includes an output terminal 3 coupled to input terminals 1 and 2 of OR gate 1.105. OR gate 1.105 has an output terminal 3 coupled to data input terminal 3 of flipflop 1.101, having a Q output terminal 5 coupled to data input terminal 3 of flipflop 1.110, whereby flipflops 1.108 and 1.110 are cascaded. AND gate 1.104 has an output terminal 3 connected to data input terminal 3 of flipflop 1.109 having a Q output terminal 5 connected to data input terminal 3 of flipflop 1.111, whereby flipflops 1.109 and 1.111 are connected in a cascade circuit.

Output terminals 3 of request enabling AND gates 1.102, 1.103, and 1.104 are coupled to input terminals 1, 2 and 3 of OR gate 1.106. OR gate 1.106 has an output terminal 4 which is connected to input terminal 1 of delay line 1.107; the signal at output terminal 4 of OR gate 1.106 is coupled as signal S0 to allocation control generator 1.8. Delay line 1.107 responds to the signal at output terminal 4 of OR gate 1.106 to derive synchronization signals for flipflops 1.108 and 1.109, which synchronization signals are supplied to clock input terminals 4 of flipflops 1.108 and 1.109 via output terminal 2 of the delay line. Delay line 1.107 also synchronizes flipflops 1.110 and 1.111 since output terminal 4 of the delay line is coupled to clock input terminals 4 of flipflops 1.110 and 1.111. Delay line 1.107 resets flipflop 1.101 to zero by virtue of a connection between output terminal 3 of the delay line and input terminal 1 of flipflop 1.101. Delay line 1.107 also derives output signals S1, S2, S3, S4 and S5 at output terminals 4, 5, 6, 7, 8, and 9 thereof. Output signals S1, S2, and S4, at taps 5, 6 and 8 of delay line 1.107 are supplied to memory energizer 1.3, allocation control generator 1.18 and memory energizer 1.13 respectively. Signals S3 and S5 at taps 7 and 9 of delay line 1.107 are supplied to additional circuits within selector-starter 1.1 as described infra.

Signals at output terminals 5 and 6 of flipflop 1.110 respectively designate the occurrence of a useful cycle and the lack of a useful cycle while signal R at output terminal 5 of flipflop 1.111 indicates the presence of a refresh cycle; in this regard consideration should again be given to FIG. 24, described supra. Signal C at output terminal 5 of flipflop 1.110 is coupled to cycle terminator 1.7 and to input terminals 1 of AND gates 1.112, 1.113 and 1.115. Signal R at output terminal 5 of flipflop 1.111 is coupled to input terminal 1 of AND gate 1.114 and to input terminal 2 of AND gate 1.112. Signal $\overline{C}$ at output terminal 6 of flipflop 1.110 is coupled to input terminal 2 of flipflop 1.114.

Each of AND gates 1.112, 1.113 and 1.114 is enabled simultaneously by coupling signal S3 from tap 7 of delay line 1.107 to input terminal 3 of the gates. At a slightly later time, AND gate 1.115 is enabled by coupling signal S5 from tap 9 of flipflop 1.107 to input terminal 2 of the AND gate. AND gate 1.112, when enabled by a signal S3, derives signal CR(S3) at output terminal 4 of the AND gate to indicate that a useful cycle is to be followed by a refresh cycle; signal CR(S3) at output terminal 4 of gate 1.112 is coupled to cycle terminator 1.7. Gate 1.113 when enabled by a signal S3 derives output signal C(S3) at output terminal 3 of the gate; signal C(S3) indicates that a useful cycle is to be performed by memory subassembly 4. Signal C(S3) at output terminal 3 of AND gate 1.113 is coupled in parallel to write control generator 1.5, reader 1.6, and allocation control generator 1.8. AND gate 1.114, when enabled by signal S3, derives signal $\overline{CR}$(S3) at output terminal 4 thereof. Signal $\overline{CR}$(S3) indicates that a refresh cycle is to be executed and is coupled from output terminal 4 of AND gate 1.114 to apparent refresh generator 1.2. Gate 1.115 when enabled by signal S5, derives signal C(S5) at output terminal 3. Signal C(S5) indicates that a useful cycle is to be executed by memory sub-assembly 4 without the sub-assembly being refreshed.

Signal C(S5) at output terminal 3 of gate 1.115 is coupled to writer network 1.4. Because of the delay in time between the derivation of signals S3 and S5, with an accompanying delay in the derivation of a signal as output terminal 3 of gate 1.115 relative to the derivation of a signal at output terminal 4 of gate 1.112 or output terminal 3 of gate 1.113, cycle terminator 1.7 is able to initiate action in response to signals C and CR(S3) prior to writer network 1.4 initiating action in response to signal C(S5). Similarly, write control generator 1.5, reader network 1.6 and allocation control generator 1.8 can respond to signal C(S3) at output terminal 3 of AND gate 1.113 prior to writer network 1.4 responding to signal C(S5) at output terminal 3 of AND gate 1.115.

Figure 7:
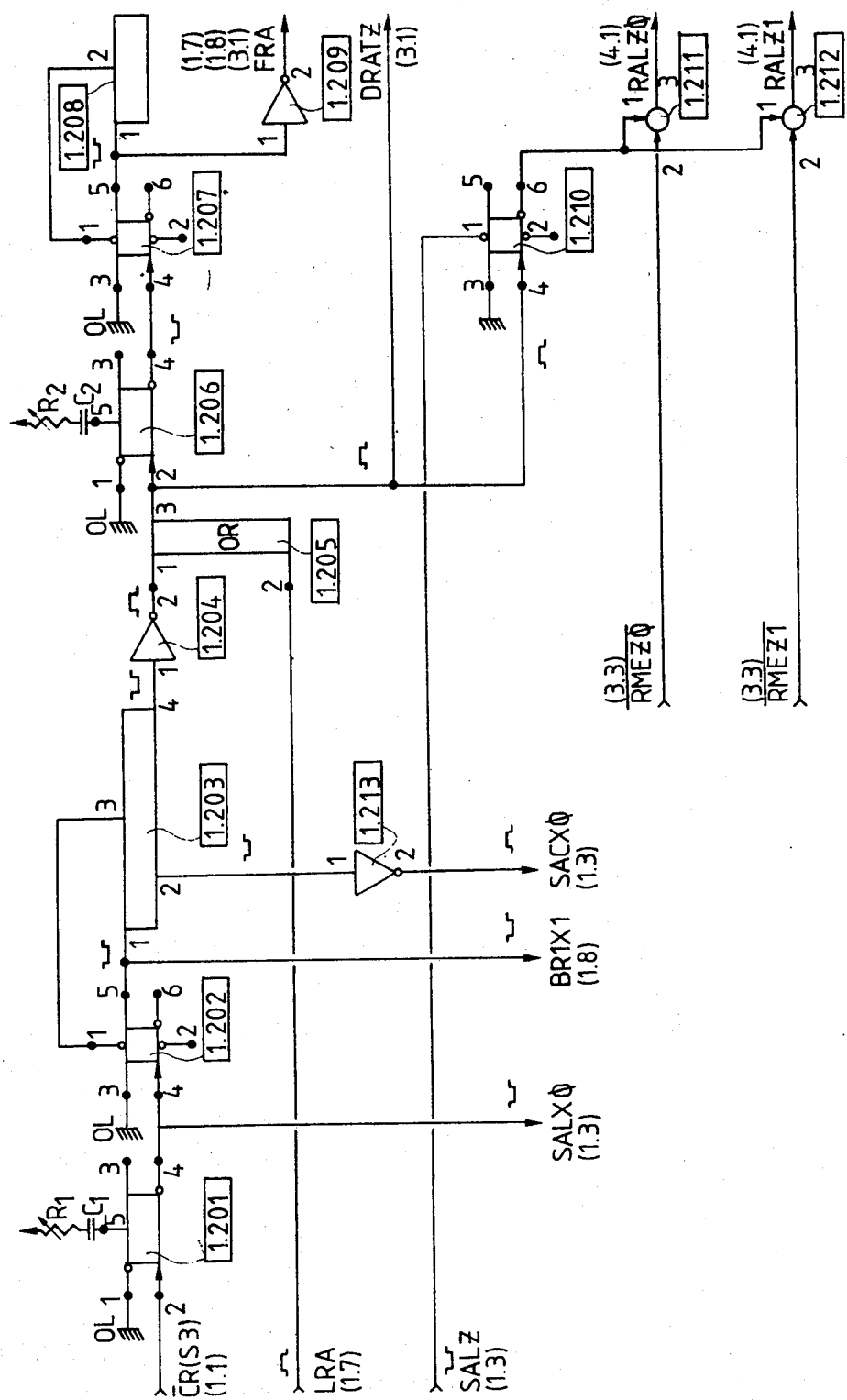
FIG. 7 is a detailed block diagram of a regeneration generator employed in the control regulator of FIG. 2.

Reference is now made to FIG. 7 of the drawing wherein there is illustrated a circuit diagram for apparent refresh generator 1.2 which is energized in response to a signal $\overline{CR}$(S3) derived from selector starter 1.1 or in response to a signal LRA, derived from cycle terminator 1.7. Apparent recycle generator 1.2 triggers the start of an apparent refresh cycle for controlling memory sub-assembly 4, to assure synchronization of the sub-assembly with appropriate synchronization of signals RALZ0 and RALZ1, derived from the apparent refresh generator and coupled to the memory sub-assembly to control activation of row addresses in the two zones of the memory.

Signal $\overline{CR}$(S3) derived from selector-starter 1.1 is supplied to clock input terminal 2 of monostable multivibrator 1.201 of apparent refresh generator 1.2. Monostable multivibrator 1.201 includes a data input terminal 1 that is enabled by being connected to a ground terminal which represents a binary zero value. Monostable multivibrator 1.201 includes an input terminal 5 that is connected to a resistor-capacitor network including series capacitor C1 and variable resistor R1, having a time constant that establishes the duration of an output signal derived at terminal 4 of the monostable. By varying the value of resistor R1, the time constant of monostable 1.201 is adjusted so that a signal derived at output terminal 4 of the monostable occurs at a predetermined interval after the signal coupled to clock input terminal 2 of the monostable. A negative pulse derived at output terminal 4 of monostable 1.201 is coupled as a memory row address control signal SALX0 to memory energizer 1.3 and to clock input terminal 1 of 1.201, having a data input terminal 3 that is grounded. The trailing, positive going edge of signal SALX0 as derived from output terminal 4 of flipflop 1.201 activates flipflop 1.202 into a binary state, whereby a negative going signal is derived from Q output terminal 5 of flipflop 1.202.

The binary signal at output terminal 5 of flipflop 1.202 is coupled to input terminal 1 of delay line 1.203, having output taps 2, 3, and 4. After a predetermined delay interval, a negative going signal is derived from tap 3 of delay line 1.203 and is coupled to reset input terminal 1 of flipflop 1.202, to cause the flipflop to change state whereby a binary 1 level is derived at output terminal 5 of the flipflop. Tap 2 of delay line 1.203 is coupled to input terminal 1 of inverter 1.213, having an output terminal 2 from which is derived signal SACX0 that is an inverted replica of the signal at output terminal 5 of flipflop 1.202, except that it is delayed by the delay time between input terminal 1 and tap 2 of delay line 1.203. Signal SACX0, at output terminal 2 of inverter 1.213 is coupled to memory energizer 1.3 to provide column address control functions for the memory. The negative going pulse at output terminal 5 of flipflop 1.202 is coupled as signal BR1X1 to allocation control generator 1.8 to control coupling of refresh and useful row address control signals to the memory.

Tap 4 of delay line 1.203, at which is derived a negative going pulse that is a replica of the negative going pulse derived at terminal 5 of flipflop 1.202, but delayed in time by the delay tme 1.203, is coupled to input terminal 1 of inverter 1.204. Inverter 1.204 has an output terminal 2 at which is derived a positive going pulse which is an inverted replica of the signal at input terminal 1 thereof, which positive going pulse is applied to input terminal 1 of OR gate 1.205. OR gate signal LRA, derived from cycle terminator 1.7 is coupled to input terminal 2 of OR gate 1.205, having an output terminal 3 from which is derived a signal DRATZ which indicates that a refresh phase for memory sub-assembly 4 is to be triggered; signal DRATZ is directly coupled to refresh energizer 3.1 as a control signal.

Signal DRATZ at output terminal 3 of OR gate 1.205 is coupled to clock input terminal 2 of monostable multivibrator 1.206, having a data input terminal 1 connected to a ground, binary zero representing potential. A positive going edge of signal DRATZ coupled to input terminal 2 of monostable 1.206 causes a negative going pulse to be derived at output terminal 4 of the monostable. The negative going pulse at output terminal 4 of monostable 1.206 has a duration determined by the values of the components in the resistor-capacitor network R2 C2, connected in series with input terminal 5 of the monostable circuit. Monostable 1.206 derives a negative pulse at output terminal 4 thereof, which pulse is applied to clock input terminal 4 of flipflop 1.207 having a grounded data input terminal 3 that represents a constant binary zero value level. The positive going edge of the trailing edge of the negative going pulse derived from output terminal 4 of monostable 1.206 coupled to flipflop 1.207 causes a negative pulse to be derived at output terminal 5 of flipflop 1.207. The negative going signal at output terminal 5 of flipflop 1.207 is coupled to input terminal 1 of delay line 1.208, having an output tap 2, that is coupled to reset input terminal 1 of flipflop 1.207. Thereby, flipflop 1.207 derives a negative going pulse during the interval between the positive going trailing edge of the signal at output terminal 4 of monostable 1.206 and the negative going pulse at tap 2 of delay line 1.208 which results from the negative going transition at output terminal 5 of flipflop 1.207 in response to the negative going transition at output terminal 4 of 1.206. The negative going pulse at output terminal 5 of flipflop 1.207 is coupled to input terminal 1 of inverter 1.209, having an output terminal 2 at which is derived signal FRA that is coupled in parallel to cycle terminator 1.7, allocation control generator 1.8 and refresh energizer 3.1; signal FRA indicates that a refresh cycle has been terminated.

Signal DRATZ at output terminal 3 of OR gate 1.205 is coupled to clock input terminal 4 of flipflop 1.210 having a grounded data input terminal 3. Flipflop 1.210 is initialized so a binary zero value is derived at output terminal 6 thereof in response to row control signal SALZ being derived from memory energizer 1.3 and being coupled to reset input terminal 1 of the flip-flop. In response to signal DRATZ, flipflop 1.210 is activated so that the binary zero state set at terminal 6 by signal SALZ is transferred to a binary 1 state. Flipflop 1.210 derives a binary 1 signal at output terminal 6 until the flipflop is reset to the zero state in response to signal SALZ. While flipflop 1.210 is in a binary 1 state, the binary 1 signal at output terminal 6 thereof enables input terminals 1 of AND gates 1.211 and 1.212, each of which has an input terminal 2 respectively responsive to signals $\overline{RMEZ0}$ and $\overline{RMEZ1}$, as derived from masked refresh recorder 3.3. When enabled by a binary 1 signal at output terminal 6 of flipflop 1.210, AND gates 1.211 and 1.212 respond to signals $\overline{RMEZ0}$ and $\overline{RMEZ1}$ to derive signals RALZ0 and RALZ1, both of which are coupled to distributor 4.1 for controlling coupling of row addresses to the zones of memory sub-assembly 4.

Figure 8:
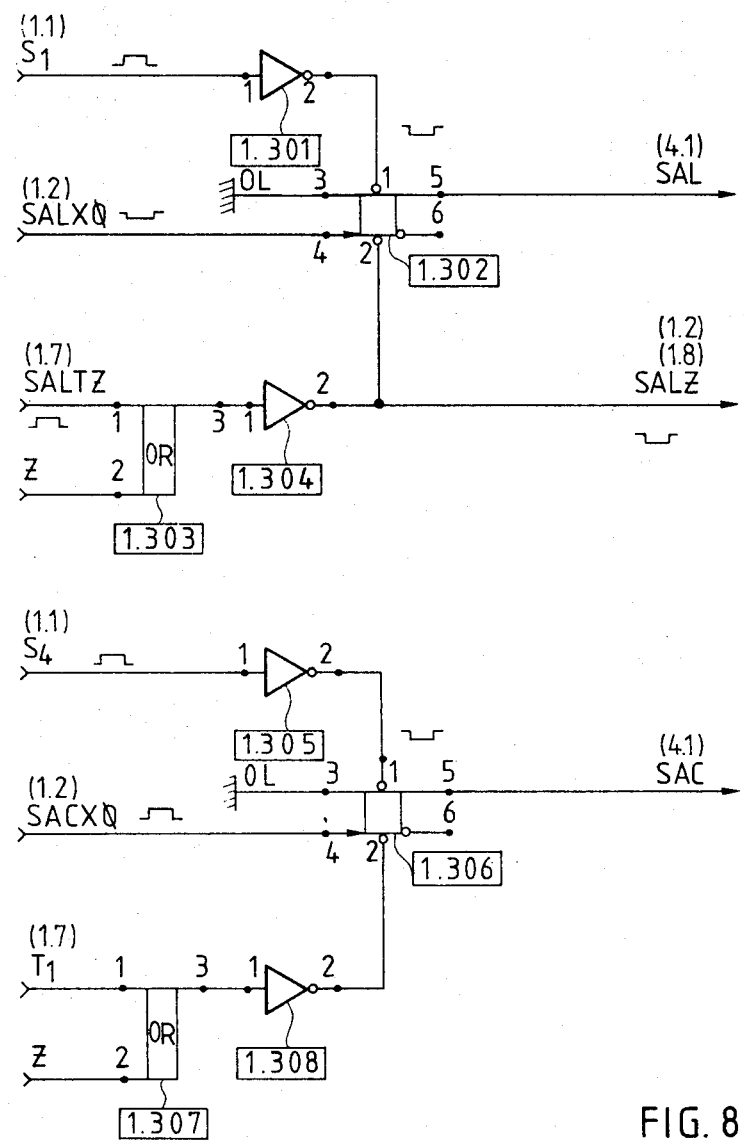
FIG. 8 is a detailed block diagram of a memory energizer utilized in the control regulator of FIG. 2.

Memory energizer 1.3, FIG. 8, is energized in response to synchronizing signals S1 and S4, derived from selector-starter 1.1. Memory energizer 1.3 actuates memory sub-assembly 4 by supplying the memory sub-assembly with control signals SAL and SAC for row and column selection in the memory sub-assembly. In addition, memory energizer 1.3 responds to signals from several components in control regulator 1, to supply timing signals to other components within the control regulator.

Signal S1, derived from selector-starter 1.1, is a positive going pulse that is reversed in polarity by inverter 1.301, by virtue of signal S1 being connected to input terminal 1 of inverter 1.301, having an output terminal 2 that is coupled to set input terminal 1 of flipflop 1.302, which when activated to a binary 1 state enables row address selection in memory sub-assembly 4. The resulting negative going pulse at output terminal 2 of inverter 1.301 causes flipflop 1.302 to be energized so that a binary 1 signal is derived at output terminal 5 of the flip-flop. The positive going signal at output terminal 5 of the flipflop 1.302 is coupled as signal SAL to instruction distributor 4.1 for memory sub-assembly 4 as an enabling signal for the rows in the memory sub-assembly. Flipflop 1.302 derives a binary 1 signal at output terminal 5 thereof until the trailing edge of a negative going pulse is derived from inverter 1.301 and signal SALX0, derived from apparent regeneration regenerator 1.2, is coupled to clock input terminal 4 of the flip-flop; this result is by virtue of data input terminal 3 of the flipflop being grounded, or at a binary zero value. Flipflop 1.302 is also reset in response to a pulse being applied to reset input terminal 2 thereof by a signal SALZ, derived from output terminal 2 of inverter 1.304.

Inverter 1.304 derives row control signal SALZ in response to signal SALTZ, derived from cycle terminator 1.7 and coupled to input terminal 1 of OR gate 1.303, having output terminal 3 that is connected directly to input terminal 1 of inverter 1.304. Thereby, inverter 1.304 derives a negative going pulse that is an inverted replica of signal SALTZ. Initializing signal Z, derived from the data processor of which the memory system is a part, is coupled to input terminal 2 of OR gate 1.303, whereby a negative pulse is derived at output terminal 2 of inverter 1.304 in response to the initializing pulse. The initializing pulse thus causes resetting of flipflip 1.302 to the binary zero state, whereby a binary zero level is initially derived from output terminal 5 of the flipflop. Signal SALZ at output terminal 2 of flipflop 1.304 is coupled in parallel to apparent refresh generator 1.2 and to allocation control generator 1.8.

Column address selection control signal SAC is derived by memory energizer 1.3 in a manner similar to the derivation of row control signal SAL. In particular, signal S4 derived from tap 8 of selector-starter 1.1 is supplied to input terminal of inverter 1.305, having an output terminal 2 at which is derived an inverted replica of signal S4. Output terminal 2 of inverter 1.305 is coupled to set input terminal 1 of flipflop 1.306 whereby the flipflop is actuated so that a binary 1 level is derived at output terminal 5 thereof in response to signal S4. The binary 1 level at output terminal 5 of flipflop 1.306 is coupled as signal SAC to instruction distributor 4.1. Flipflop 1.306 includes a grounded, or binary zero data input terminal 3 and a clock input terminal 4 responsive to signal SACX0 as derived from apparent refresh generator 1.2. Signal SACX0 causes flipflop 1.306 to return to a state whereby SAC signal at output terminal 5 of the flipflop returns to a binary zero level.

Flipflop 1.306 includes a zero reset input terminal 2 which causes the flipflop to be activated to a state whereby signal SAC at terminal 5 of the flipflop has a binary zero state. To this end, signal T1 derived from cycle terminator 1.7 is coupled to input terminal 1 of OR gate 1.307, having an output terminal 3 that is connected to input terminal 1 of inverter 1.308. Thereby, a binary 1 level for signal T1 causes signal SAC to have a binary zero value. Initializing signal Z derived from the data processing system of which the memory system is a part is supplied to input terminal 2 of OR gate 1.307 whereby flipflop 1.306 is assured of being in a zero state initially, such that signal SAC initially has a zero value.

Figure 9:
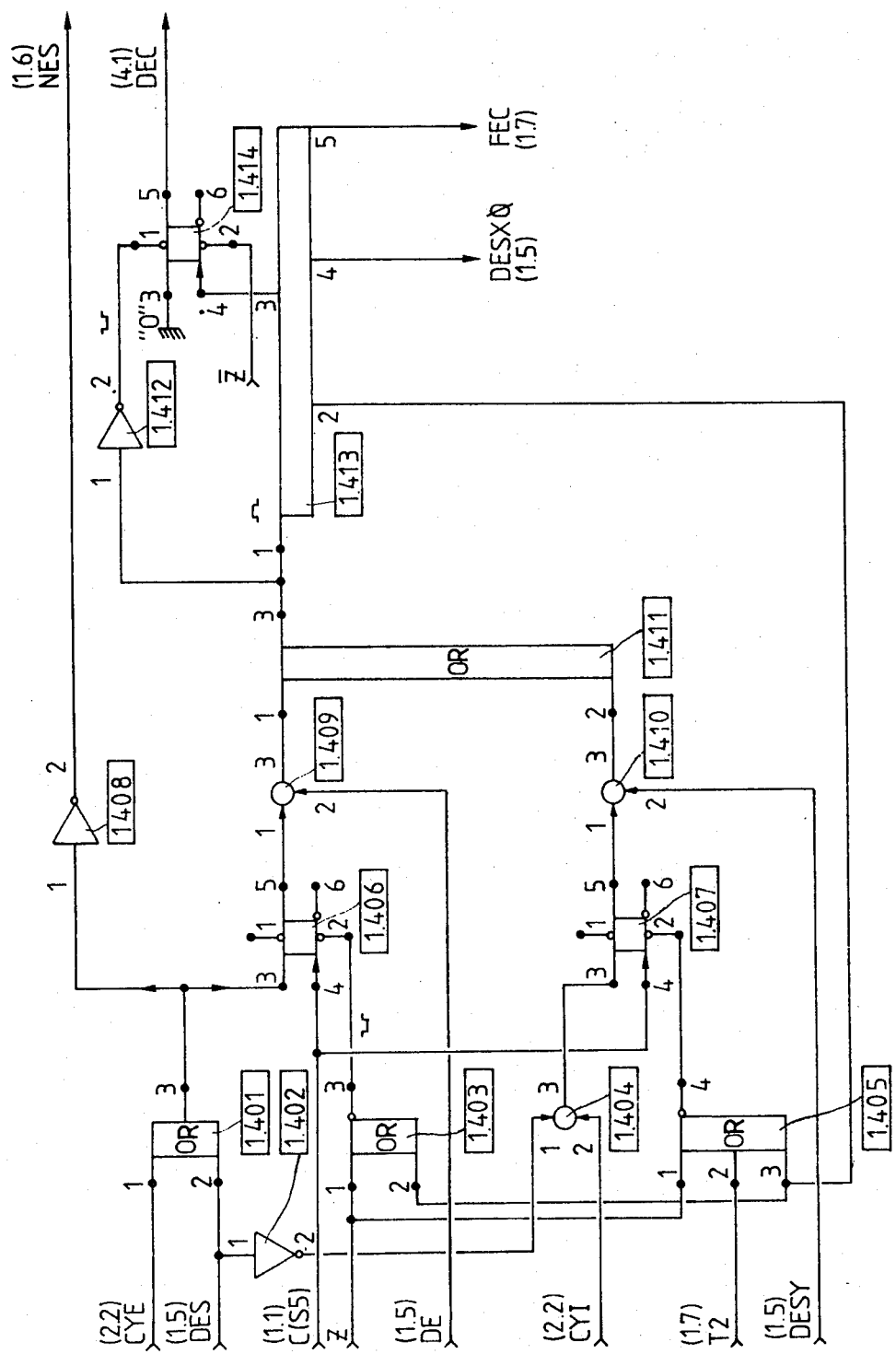
FIG. 9 is a detailed block diagram of a write control source utilized in the control regulator of FIG. 2.

Reference is now made to FIG. 9 of the drawing wherein there is illustrated a block diagram of writer circuit 1.4. Writer circuit 1.4 triggers a write operation of memory sub-assembly 4 by supplying the memory sub-assembly with signal DEC when the write operation is requested by signal DE, derived from write control generator 1.5, and when other conditions associated with a write operation have been fulfulled, as indicated by signals DES, DESY and DESX0, derived from the write control generator. The write operation is triggered by writer or write network 1.4 when the write network derives signal DEC and supplies it to memory sub-assembly instruction distributor 4.1.

Write network 1.4 includes two different channels for instigating write initiation operations in memory sub-assembly 4. AND gate 1.409 includes input terminal 1, connected to be responsive to the signal derived at output terminal 5 of flipflop 1.406. Flipflop 1.406 is activated so that a binary 1 is derived at output terminal 5 thereof in response to a binary 1 signal being applied to data input terminal 3 of the flipflop while a positive, going, leading edge of signal C(S5) is being coupled to clock input terminal 4 of the flipflop by selector starter 1.1. The signal applied to data input terminal 3 of flipflop 1.406 is derived from output terminal 3 of OR gate 1.401, having input terminals 1 and 2 respectively responsive to signal CYE, derived from function register 2.2, and signal DES, derived from write control generator 1.5. Thus, if either signal CYE or signal DES has a binary 1 value while a positive going, leading edge, transition of signal C(S5) is occurring, flipflip 1.406 is activated so that a binary 1 signal is supplied by output terminal 5 thereof to input terminal 1 of AND gate 1.409.

Output terminal 3 of OR gate 1.401 is also coupled to input terminal 1 of inverter 1.408 having output terminal 2 on which is derived signal NES that is coupled to reader network 1.6. Flipflop 1.406 is reset so that a binary zero is derived at output terminal 5 thereof in response to a binary 1 signal being derived from output terminal 3 of NOR gate 1.403. NOR gate 1.403 includes input terminal 1, responsive to initializing signal Z as derived from the data processing system of which the memory system of the present invention is a part, whereby flipflop 1.406 is initially at a state wherein the signal at output terminal 5 has a binary zero value. Flipflop 1.406 is also reset so that the signal at output terminal 5 thereof has a zero value a predetermined interval after the flipflop derives a binary 1 signal during the interval while signal DE has a binary 1 value; this resetting action of flipflop 1.406 is in response to the signal at output terminal 3 of NOR gate 1.403 as described in greater detail in infra.

The second channel for initiating a write operation mode by write network 1.4 includes AND gate 1.410, having an input terminal 2 responsive to signal DESY, as derived from write control generator 1.5. AND gate 1.410 includes a second input terminal 1 responsive to a binary 1 output signal at output terminal 5 of flipflop 1.407. A binary 1 signal is derived at output terminal 5 of flipflop 1.407 in response to a binary 1 signal being applied to data input terminal 3 of the flipflop while a positive going transition is occurring in signal C(S5) which is supplied to clock input terminal 4 of the flipflop by selector-starter 1.1. Data input terminal 3 of flipflop 1.407 is responsive to a binary 1 level derived at output terminal 3 of AND gate 1.404 having an input terminal 1 responsive to signal DES as derived from output terminal 2 of inverter 1.402. Inverter 1.402 includes an input terminal 1 responsive to signal DES as derived from write control generator 1.5. Input terminal 2 of AND gate 1.404 is responsive to signal CYI, derived from function register 2.2. Flipflop 1.407 is reset so that a binary 1 signal is derived at output terminal 5 thereof in response to a binary 1 output signal at output terminal 4 of NOR gate 1.405. NOR gate 1.405 includes input terminals 1, 2, and 3, respectively responsive to initializing signal Z, signal T2 derived from cycle terminator 1.7, and a signal which controls the length of time that a binary 1 signal is derived from output terminal 5 of flipflop 1.407 in the same manner that the time duration of a binary 1 signal derived from terminal 5 of flipflop 1.406 is controlled. Thereby, flipflop 1.407 is initially set to a state wherein the signal at output terminal 5 thereof has a binary zero value in response to the positive going transition of initializing signal Z, derived from the remainder of the data processing system of which the memory system of the present invention is a part. In addition, signal T2 causes the signal at output terminal 5 of flipflop 1.407 to have a binary zero value when a cycle being executed by memory sub-assembly 4 has been completed.

AND gates 1.409 and 1.410 have output terminals 3 at which are derived binary 1 signals for either of the two write initiation modes. The binary 1 signals at output terminals 3 of AND gates 1.409 and 1.410 are respectively coupled to input terminals 1 and 2 of OR gate 1.411, having an output terminal 3. Thereby, a binary 1 signal is derived from output terminal 3 of OR gate 1.411 when either of the two write initiation modes occur.

The binary 1 signal at output terminal 3 of OR gate 1.411 is applied to input terminal 1 of delay line 1.413, having output taps 2, 3, 4, and 5. Output tap 2 of delay line 1.413 is coupled in parallel to input terminals 2 and 3 of NOR gates 1.403 and 1.405 respectively, to control the duration of binary 1 levels at output terminals 5 of flipflops 1.406 and 1.407. Thus, the duration of a binary 1 output signal of flipflop 1.406 or 1.407 is equal to approximately the delay time between input terminal 1 and output tap 2 of delay line 1.413. At taps 4 and 5 of delay line 1.413 are derived signals DESX and FEC, which are respectively applied to write control generator 1.5 and to cycle terminator 1.7, so that the write control generator responds to signal DESX0 prior to cycle terminator 1.7 responding to signal FEC.

Signal DEC for initiating a write operation in memory sub-assembly 4 is derived in synchronism with the derivation of a binary 1 signal at output terminal 3 of delay line 1.413 in response to a binary 1 signal at output terminal 3 of OR gate 1.411. To these ends, output terminal 3 of OR gate 1.411 is coupled to input terminal 1 of inverter 1.412, having output terminal 2 that is connected to set input terminal 1 of flipflop 1.414. Flipflop 1.414 includes a grounded data input terminal 3 and a clock input terminal 4 responsive to the signal at tap 3 of delay line 1.413. Thereby, flipflop 1.414 derives a binary 1 DEC signal at output terminal 5 thereof when a negative going transition is derived at output terminal 2 of inverter 1.412, at the beginning of the write initiation mode. Signal DEC at output terminal 5 of flipflop 1.414 returns to a zero state in response to a binary 1 output at tap 3 of delay line 1.413, as occurs a predetermined time after the flipflop is activated to a state enabling the signal at terminal 5 to be a binary 1 value. Flipflop 1.414 is initially set to zero state by coupling a complemented replica of the initializing signal Z derived by the data processing system of which the memory system is a part to reset input terminal 2 of the flipflop.

Figure 10:
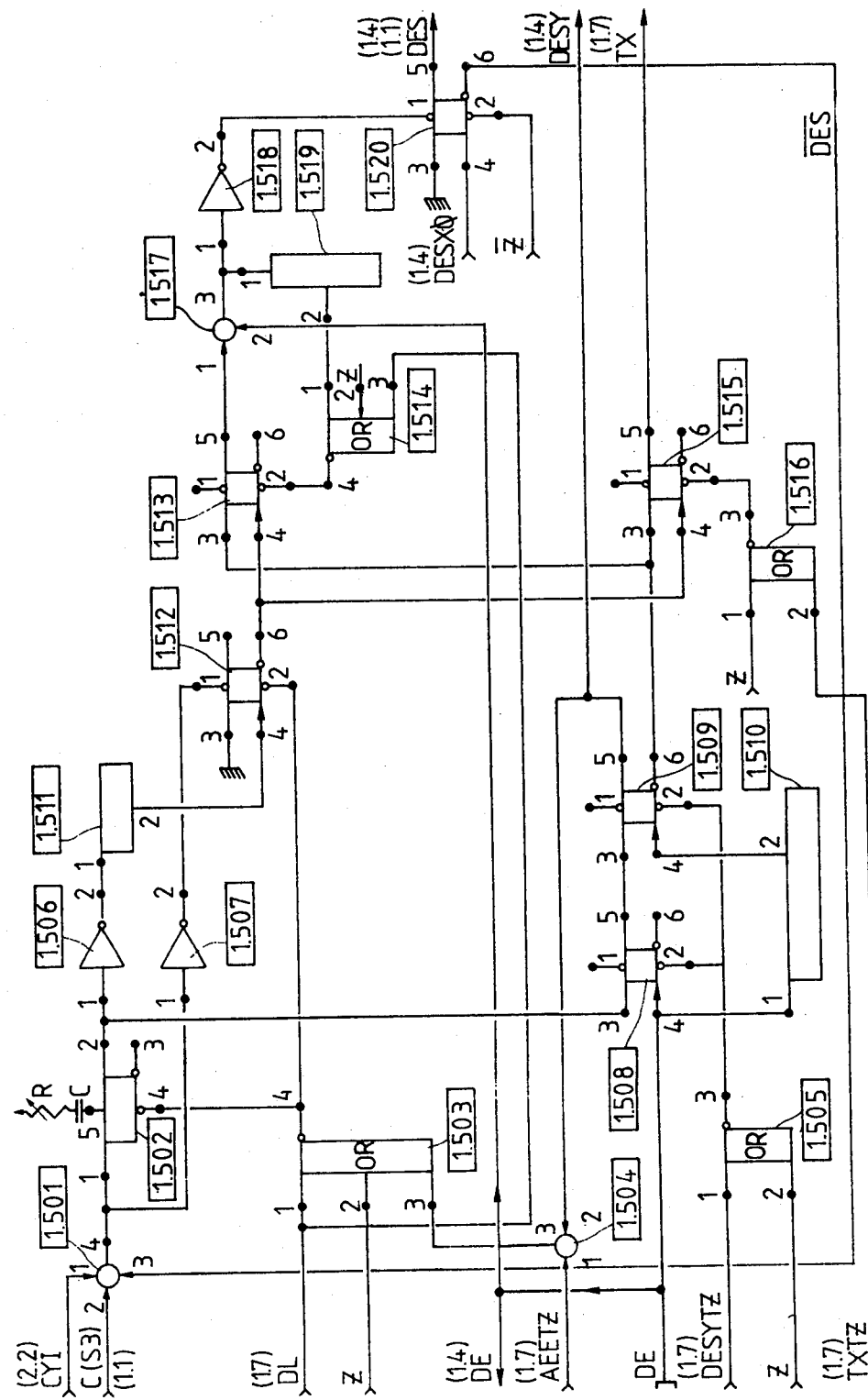
FIG. 10 is a detailed block diagram of a write control generator utilized in the control regulator of FIG. 2.

Write control generator or write controller 1.5, illustrated in detail in FIG. 10, controls the derivation of signals for write circuit 1.4 and selector-starter 1.1 in response to write command signal DE, derived from the remainder of the data processing system of which the memory system is a part. Signal DE is derived by the data processing unit when the data processing system desires to write information into memory sub-assembly 4. Write requests are derived from the data processing unit as a function of the availability of the memory sub-assembly, such that write cycles can be initiated in the memory sub-assembly only under very predetermined and precise timing conditions. Because write controller 1.5 manages write requests from the data processing unit in very precise, predetermined timing conditions the write controller can verify the operation of writing network 1.4 by means of signals DE, DES, and DESY. Activation of write controller 1.5 is dependent on the various components to which it is coupled and which are included therein.

Write control generator 1.5 responds to signal C(S3) derived from selector-starter 1.1 and indicative of a useful cycle; signal C(S3) is coupled to input terminal 2 of AND gate 1.501. AND gate 1.501 also includes input terminals 1 and 3 respectively responsive to signal CYI derived from function register 2.2 and signal DES, as derived from output terminal 6 of flipflop 1.520 as described supra. AND gate 1.501 includes an output terminal 4 that is coupled in parallel to input terminal 1 of monostable multivibrator 1.502 and to input terminal 1 of inverter 1.507. Thus, signal C(S3) selectively triggers monostable 1.502 and initializes flipflop 1.512 so that output terminal 6 thereof initially has a binary zero level, by virtue of a connection between set input terminal 1 and output terminal 2 of inverter 1.507. Flipflop 1.502 responds to the signal at output terminal 4 of AND gate 1.501 to derive a positive voltage at output terminal 3; the positive signal at output terminal 2 of monostable 1.502 has a duration determined by the values of the resistor and capacitor connected in series to input terminal 5 of the monostable.

The signal derived at output terminal 2 of monostable 1.502 is coupled in parallel to data input terminal 3 of flipflop 1.508, and to input terminal 1 of inverter 1.506 having an output terminal 2 that is directly connected to input terminal 1 of delay line 1.511, having an output tap 2, connected to clock input terminal 4 of flipflop 1.512. Thus, clock input terminal 4 of flipflop 1.512 is responsive to a delayed and inverted replica of the signal supplied to data input terminal 3 of flipflop 1.508. Data input terminal 3 of flipflop 1.512 is grounded to provide a permanent binary zero input to terminal 3 whereby a binary zero value is transferred to flipflop 1.512 in response to the positive going trailing edge of the complemented signal supplied to clock input terminal 4 of flipflop 1.512 whereby a binary 1 signal is derived at output terminal 6 of the flipflop in response to the derivation of the positive going, trailing edge of the signal at output terminal 2 of delay line 1.511.

Flipflop 1.512 and monostable 1.502 respectively include input terminals 2 and 4, directly connected to output terminal 4 of NOR gate 1.503, whereby the monostable and flipflop are reset to zero in response to a binary zero signal being coupled by NOR gate 1.503 to output terminal 4 thereof. NOR gate 1.503 includes input terminals 1, 2, and 3, respectively responsive to signal DL, initializing signal Z and the signal at output terminal 3 of AND gate 1.504. Signal DL is supplied to input terminal 1 of NOR gate 1.503 by cycle terminator 1.7, while initializing signal Z is supplied to the NOR gate by the data processing system of which the memory system is a part. AND gate 1.504 includes input terminal 1 responsive to signal AEETZ, derived from cycle terminator 1.7, as well as an input terminal 2, responsive to a signal at output terminal 5 of flipflop 1.509. In response to a binary 1 being supplied to any of the input terminals of NOR gate 1.503, monostable 1.502 and flipflop 1.512 are reset.

AND gate 1.504 is enabled by a binary 1 signal at output terminal 5 of flipflop 1.509 in response to a predetermined combination and timing relationship between (1) write initiation interface signal DE, as derived from the data processing system of which the memory assembly is a part, (2) useful cycle indicating signal C(S3) and (3) signal CYI. In particular, the signal at output terminal 2 of monostable 1.502 is coupled to a data input terminal 3 of flipflop 1.508 having a clock input terminal 4 directly responsive to write control interface signal DE. If a positive going transition of signal DE occurs while monostable 1.502 is in an unstable state in response to the signal at output terminal 4 of AND gate 1.501, flipflop 1.508 is activated to a binary 1 state, whereby a binary 1 signal is derived from output terminal 5 thereof.

The binary 1 signal at output terminal 5 of flipflop 1.508 is coupled to data input terminal 3 of flipflop 1.509, having a clock input terminal 4 responsive to a signal at tap 2 of delay line 1.510, having an input terminal 1 that is driven in parallel with clock input terminal 4 of flipflop 1.508 by signal DE. This circuitry enables the binary 1 level at output terminal 5 of flipflop 1.508 to be transferred to a binary 1 level at output terminal 5 of flipflop 1.509. The delay time of delay line 1.510 between input terminal 1 and tap 2 thereof assures automatic synchronization of the signal at output terminal 5 of flipflop 1.509 with the output signal of monostable 1.502. The signal at output terminal 5 of flipflop 1.509 is coupled as signal DESY to write network 1.4, and as an enable signal to input terminal 2 of AND gate 1.404, having an output terminal 3 on which is derived a control signal for resetting of monostable 1.502 and flipflop 1.512 as described supra. Flip-flops 1.508 and 1.509 are reset to zero by virtue of connections between reset input terminals 2 thereof and output terminal 3 of NOR gate 1.505. NOR gate 1.505 includes input terminals 1 and 2, respectively responsive to signal DESYTZ, derived from cycle terminator 1.7 and initializing signal Z derived from the remainder of the data processing system. Thereby, flipflops 1.508 and 1.509 are initially activated so that binary zero signals are derived at output terminals 5 thereof, as well as upon completion of a memory cycle.

Flipflop 1.509 includes a complementary output terminal 6, at which is derived a signal that is an inverted replica of the signal at output terminal 5 of the flipflop.

The signal at output terminal 6 of flipflop 1.509 is coupled to a data input terminal 3 of flipflop 1.515, having a clock input terminal 4 connected to the complementary (Q) output terminal 6 of flipflop 1.512. In response to the signal at complementary output terminal 6 of flipflop 1.509 having a binary one value simultaneously with the derivation of a positive going transition at complementary output terminal 6 of flipflop 1.512, flipflop 1.515 is activated to a set state whereby a binary 1 signal TX is derived at output terminal 5 of flipflop 1.515. Signal TX is supplied as a control signal to cycle terminator 1.7. Signal TX remains at a binary 1 level until the signal at output terminal 5 of flipflop 1.515 is reset to a zero value in response to a binary 1 being derived from output terminal 3 or NOR gate 1.516; the output of NOR gate 1.516 is coupled to reset input terminal 2 of flipflop 1.515. NOR gate 1.516 includes input terminals 1 and 2, respectively responsive to initializing signal Z and signal TXTZ, derived from cycle terminator 1.7. Thus, flipflop 1.515 is initially set at a zero level, and is set to a zero level at the end of each cycle of the memory assembly.

The signal at complementary output terminal 6 of flipflop 1.509 is coupled to data input terminal 3 of flipflop 1.513, having a clock input terminal 4 connected to a complementary output terminal 6 of 1.512. Flipflop 1.513 is triggered into a binary 1 state whereby a binary 1 level is derived at output terminal 5 thereof in response to a positive going transition being coupled to input terminal 4 of flip-flop 1.513 from output terminal 6 of flipflop 1.512 while a binary 1 level is coupled from output terminal 6 of flipflop 1.509 to input terminal 3 of flipflop 1.513.

The binary 1 output signal at terminal 5 of flipflop 1.513 is coupled to input terminal 1 of AND gate 1.517, having an input terminal 2 responsive to interface signal DE, derived from the remainder of the data processing system and indicative of a write cycle being requested by the data processing system. AND gate 1.517 includes an output terminal 3 on which is derived a binary 1 level in response to signal DE having a binary 1 value simultaneously with a binary 1 level being derived at output terminal 5 of flipflop 1.513. The binary 1 output signal of AND gate 1.517 is coupled to input terminal 1 of delay line 1.519 having an output tap 2 which is connected to input terminal 1 of NOR gate 1.514. NOR gate 1.514 includes input terminals 2 and 3, respectively responsive to initializing signal Z and to signal DL, as derived from cycle terminator 1.4. NOR gate 1.514 includes an output terminal 4, connected to reset terminal 2 of flipflop 1.513. Thereby, flipflop 1.513 is reset so that a binary zero is derived at output terminal 5 thereof a predetermined time after a binary 1 level is derived at this output terminal 5; the predetermined time interval is determined by the delay time of delay line 1.519 between input terminal 1 and output tap 2 thereof. Flipflop 1.513 is also initially reset by initializing signal Z, or in response to a cycle of the memory assembly being completed, as indicated by signal DL.

The signal at output terminal 3 of AND gate 1.517 is also coupled to input terminal 1 of inverter 1.518, having an output terminal 2 connected to set input terminal 1 of flipflop 1.520. Flipflop 1.520 includes a grounded data input terminal 3, and a clock input terminal 4 responsive to signal DESX0 as derived from write network 1.4. Flipflop 1.520 is initially activated to a binary zero state by coupling the complemented initializing signal $\overline{Z}$ to reset input terminal 2 of the flip-flop. Flipflop 1.520 includes output terminals 5 and 6, on which are respectively derived signals DES and $\overline{DES}$; signal DES is supplied to selector-starter 1.1 and to write network 1.4 while the complement thereof, signal $\overline{DES}$, is coupled to terminal 3 of AND gate 1.501, to enable signal C(S3) to be coupled through gate 1.501 initially. Signal DES at output terminal 5 of flipflop 1.520 is reset to a zero value in response to a positive going transition of signal DESX0 as derived from write network 1.4. In response to a binary 1 signal at output terminal 3 of AND gate 1.517, flipflop 1.520 is activated so that a binary 1 signal is derived at output terminal 5 thereof whereby binary 1 values for signal DES are coupled to selector-starter 1.1 and write network 1.4.

Figure 11:
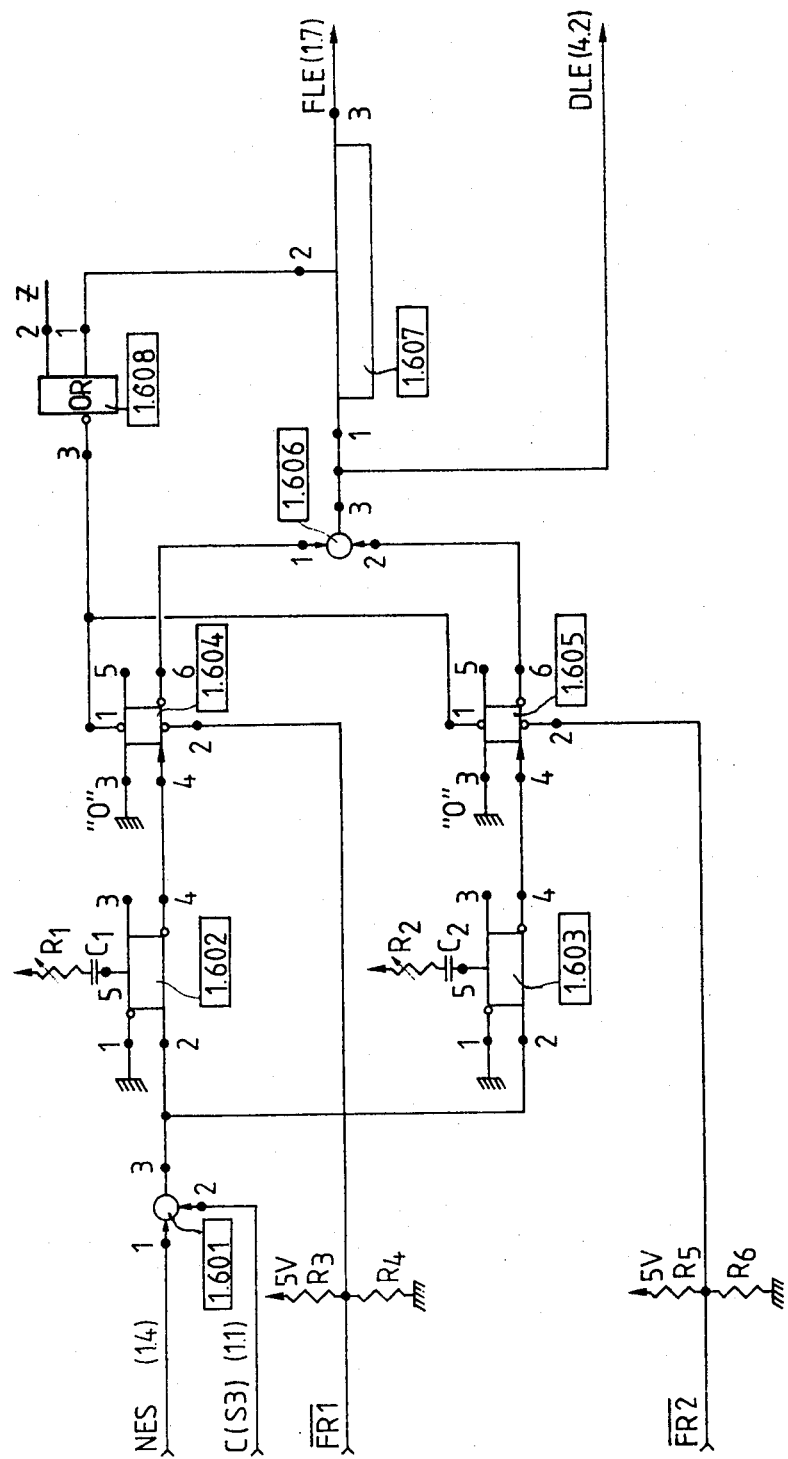
FIG. 11 is a detailed block diagram of a reader circuit employed in the control regulator of FIG. 2.

Reader or read energizer 1.6, as illustrated in detail in FIG. 11, is responsive to signal C(S3) derived from selector-starter 1.1 when a useful cycle is to be commenced. Reader 1.6 responds to signal C(S3) to trigger read action in memory sub-assembly 4 by deriving signal DLE which commands an addressed zone in memory zone 4.2 to supply data signals to a data processing system of which the memory system of the present system is a part.

Signal C(S3) derived from selector-starter 1.1 is supplied as an enable signal to input terminal 2 of AND gate 1.601, having an input terminal 1 responsive to signal NES derived by writer 1.4. AND gate 1.601 has an output terminal 3 that is connected in parallel to input terminals in monostable 1.602 and 1.603. Monostables 1.602 and 1.603 include input terminals 1, each of which is grounded to provide a constant binary zero level to the monostables. In response to a binary 1 signal at output terminal 3 of AND gate 1.601, each of monostables 1.602 and 1.603 derives, at output terminals 4 thereof, a negative pulse. The periods of the negative pulses derived from output terminals 4 of monostables 1.602 and 1.603 are respectively determined by the values of the impedances of R1, C1 and R2, C2, of series resistance-capacitance circuits connected to input terminals 5 of the monostables. Positive going trailing edges of the pulses supplied by monostables 1.602 and 1.603 to output terminals 4 thereof occur at different times determined by the different values of resistors R1 and R2. Output terminals 4 of monostables 1.602 and 1.603 are respectively connected to clock input terminals 4 of flipflops 1.604 and 1.605. Flipflops 1.604 and 1.605 both have a grounded data input terminals 3 whereby binary zero levels are constantly applied to the data input terminals of the flipflops. Thereby, output terminals 5 and 6 of both flipflops are set to zero and one binary levels in response to the positive going transitions at clock input terminals 4 of the flip-flops.

Initially, flipflops 1.604 and 1.605 are activated so that binary zero signals are derived from output terminals 6 thereof. To this end, initializing signal Z is supplied to input terminal 2 of NOR gate 1.608, having output terminal 3 that is connected in parallel to set input terminals 1 of flipflops 1.604 and 1.605. In addition, in response to a binary 1 signal being derived at output terminal 6 at both of flipflops 1.604 and 1.605, the flipflops are activated so that binary zero levels are derived at output terminals 6 thereof, a result achieved by supplying signals at output terminals 6 of flipflops 1.604 and 1.605 to input terminals 1 and 2 of AND gate 1.606. AND gate 1.606 has an output terminal 3 at which is derived read control signal DLE that is supplied to a designated memory zone in memory sub-assembly 4.2. The binary 1 signal at output terminal 3 of AND gate 1.606 is connected directly to input terminal 1 of delay line 1.607, having an intermediate tap 2, connected directly to input terminal 1 of NOR gate 1.608. By virtue of output terminal 3 of NOR gate 1.608 being connected to set input terminals 1 of flipflops 1.604 and 1.605, binary zero levels are derived at output terminal 6 of the flipflops a predetermined time interval after terminals 6 of both flipflops are in a binary 1 state. Flipflops 1.604 and 1.605 are selectively activated at will, so that binary 1 levels are derived at output terminals 6 thereof. To this end, reset terminals 2 of flipflops 1.604 and 1.605 are connected to taps of first and second voltage dividers respectively including resistors R3, R4 and R5, R6, connected between a positive DC voltage source and ground, whereby DC voltages are coupled to reset input terminals 2 of 1.604 and 1.605. To reset flipflops 1.604 and 1.605 at will, the taps of the first and second voltage dividers are connected to external signal sources $\overline{FR1}$ and $\overline{FR2}$. When it is desired to reset flipflops 1.604 and 1.605 so that binary zero levels are derived at output terminals 6 thereof, signals $\overline{FR1}$ and $\overline{FR2}$ are respectively derived whereby the taps of the first and second voltage dividers are respectively grounded. Grounding reset input terminals 2 of flipflops 1.604 and 1.605 causes binary zero signals to be derived at output terminals 6 of the respective flip-flops.

After flipflops 1.604 and 1.605 have been activated so that binary zero signals are derived at output terminals 6 thereof in response to the signal at output terminal 3 of NOR gate 1.608 being responsive to the signal at tap 2 of delay line 1.607, the delay line derives signal FLE at output terminal 3 thereof. Signal FLE is supplied by delay line 1.607 to cycle terminator 1.7 to signal to the cycle terminator that a read cycle within memory subassembly 4 has occurred.

Figure 12:
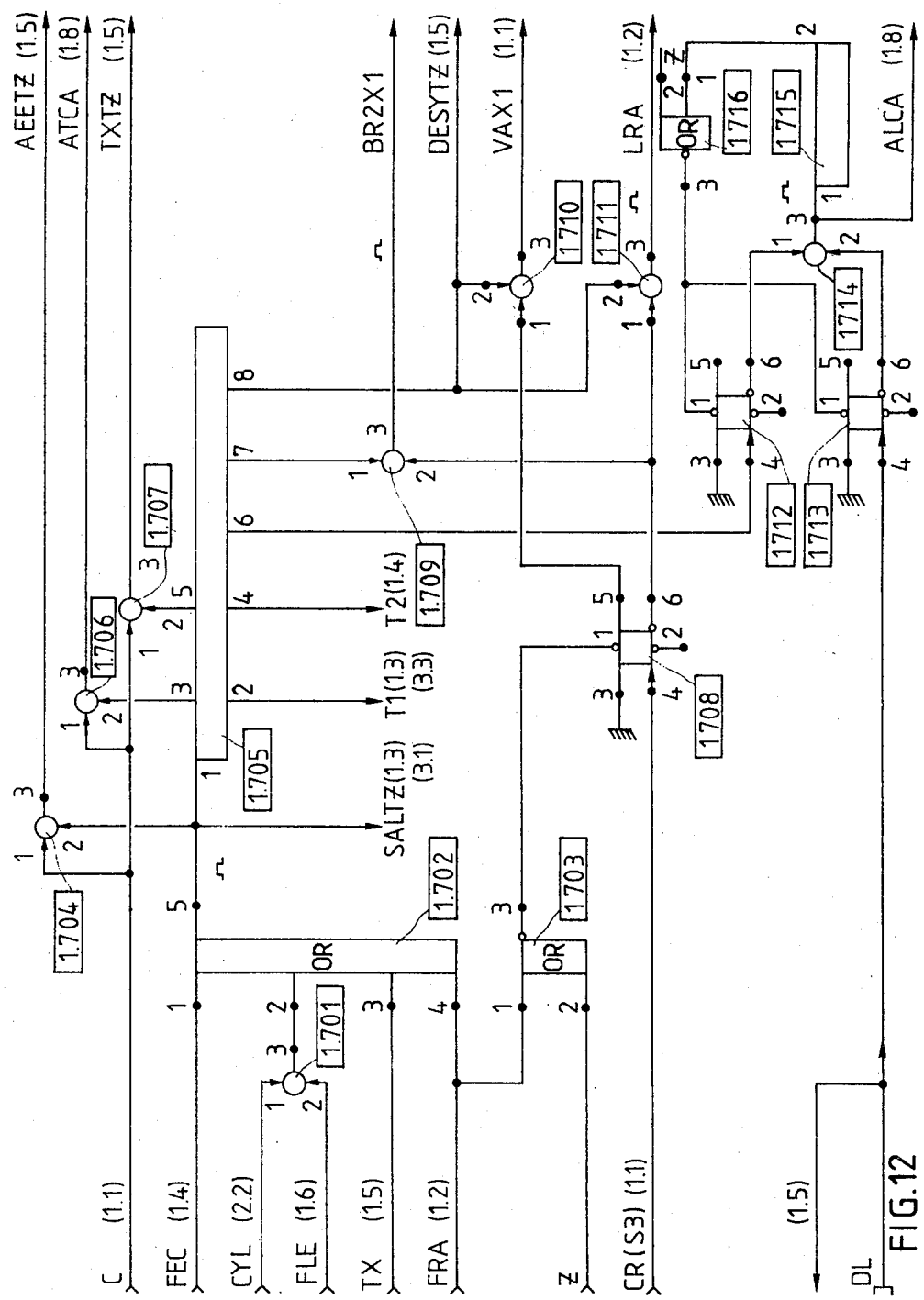
FIG. 12 is a detailed block diagram of a cycle terminator utilized in the control regulator of FIG. 2.

Reference is now made to FIG. 12 of the drawing wherein there is illustrated a detailed block diagram of cycle terminator or reload operator 1.7. Cycle terminator 1.7 responds to signals from other sub-components of the control regulator 1 which indicate that a cycle has occurred, to derive signal VAX1 which reinitializes selector-starter 1.1 for the next cycle of memory subassembly 4. Exemplary of the signals to which cycle terminator 1.7 is responsive are signals FMC, FLE, and FRI, respectively derived from writer 1.4, reader 1.6, and apparent refresh generator 1.2 during different cycles of the memory system.

Cycle terminator 1.7 includes a logic network containing AND gate 1.701, and OR gate 1.702, having input terminals 1, 3 and 4 respectively responsive to signals FED, TX and FRA, respectively derived from writer 1.4, write control generator 1.5 and apparent refresh generator 1.2. Gate 1.702 also includes input terminal 2, responsive to a signal at output terminal 3 of AND gate 1.701, in turn having input terminals 1 and 2 respectively responsive to signal CYL from function register 2.2 and signal FLE from reader 1.6. Signal C, derived from selector-starter 1.1 is applied to input terminal 2 of AND gate 1.704, and is coupled to memory energizer 1.3, as well as to refresh energizer 3.1 as signal SALTZ. Delay line 1.705 responds to a binary 1 output of OR gate 1.702 to derive time displaced synchronizing pulses T1 and T2 at taps 2 and 4 of the delay line; pulse T1 is supplied as a control signal to memory energizer 1.3 and to masked refresh recorder 3.3 while pulse T4 is supplied as a control signal to writer 1.4. Delay line 1.705 includes an output tap 3, at which is derived a replica of the binary 1 signal at output terminal 5 of OR gate 1.702; the signal at tap 3 occurs at a time between the derivation of pulses T1 and T2. The signal at tap 3 of delay line 1.705 is coupled to input terminal 2 of AND gate 1.706 having a further input terminal 1 responsive to signal C, as derived from selector-starter 1.1 to indicate that a useful cycle has been instigated. AND gate 1.706 includes an output terminal 3 from which is derived signal ACTA which is coupled to allocation control generator 1.8.

Delay line 1.705 includes output tap 5 on which is derived a binary 1 level subsequent to the derivation of a binary 1 level at output tap 4 of the delay line. The binary 1 signal derived at tap 5 of delay line 1.705 is coupled to input terminal 2 of AND gate 1.707, having an input terminal 1 responsive to signal C, as derived from selector-starter 1.1. AND gate 1.707 includes output terminal 3 on which is derived signal TXTZ which is supplied to write control generator 1.5. Thereby, signal C is also supplied to input terminal 1 of AND gate 1.704 having an output terminal 3 on which is derived signal AEETZ that is supplied to write control generator 1.5. Thereby, when a useful cycle is being executed, as indicated by a binary 1 state of signal C, signals AEETZ, ATCTA, and TXTZ are derived in sequence and respectively supplied to write control generator 1.5, allocation control generator 1.8, and write control generator 1.5.

Delay line 1.705 includes additional output taps 6, 7, and 8 on which are derived replicas of the binary 1 signal at output terminal 5 of OR gate 1.702, at different, synchronized delay intervals. The signals at taps 6 and 7 of delay line 1.705 are respectively coupled to a clock input terminal 4 of flipflop 1.702 and to input terminal 1 of AND gate 1.709, while the signal at tap 8 of the delay line is applied in parallel to terminals 2 of AND gates 1.710 and 1.711. In addition, the signal at tap 8 of delay line 1.705 is supplied to write control generator 1.5 as signal DESYTZ.

The signal at tap 8 of delay line 1.705 synchronizes and controls the derivation of signals VAX1 and LRA which respectively control initiation of a new cycle by being coupled to selector-starter 1.1 and the beginning of a refresh phase by being coupled to apparent refresh generator 1.2. To these ends, signal FRA indicative of completion of an apparent refresh operation, is supplied by apparent refresh generator 1.2 to input terminal 1 of NOR gate 1.703, having a second input terminal 2 responsive to initializing signal Z. NOR gate 1.703 includes an output terminal 3 on which is derived a 1 signal that is coupled to set input terminal 1 of flipflop 1.708. Flipflop 1.708 has a grounded data input terminal 3 and a clock input terminal 4, responsive to signal CR(S3), as derived from selector-starter 1.1 to indicate that a useful and refresh cycle are to be instigated. Initially, flipflop 1.708 is activated so that a binary 1 is derived from output terminal 5 thereof and a binary 0 is derived from terminal 6 thereof in response to a binary 1 signal at output terminal 3 of NOR gate 1.703. In response to signal CR(S3) coupled to clock input terminal 4 of flipflop 1.708 having a positive going transition while NOR gate 1.705 is responsive to signal FRA or signal Z, flipflop 1.708 is activated so that binary 0 and 1 levels are derived from output terminals 5 and 6 thereof respectively. The signals at output terminals 5 and 6 of flipflop 1.708 are respectively coupled to input terminals 1 of AND gates 1.710 and 1.711. AND gates 1.710 and 1.711 include output terminals 3 on which are respectively derived signals VAX1 and LRA that are supplied to selector-starter 1.1 and apparent refresh generator 1.2, as indicated supra, whereby derivation of signals VAX1 and LRA during any particular cycle of the memory system are mutually exclusive.

The binary 1 signal at output terminal 6 of flipflop 1.708 is coupled to input terminal 2 of AND gate 1.709, having input terminal 1 responsive to the synchronized signal at tap 7 of delay line 1.705. In response to binary 1 signals being simultaneously applied to output terminals 1 and 2 of AND gate 1.709, the AND gate derives a binary 1 signal on output terminal 3 thereof. The binary 1 signal on output terminal 3 of AND gate 1.709 is coupled as signal BR2X1 to allocation control generator 1.8, whereby the allocation control generator is responsive to the output of gate 1.709 prior to signals DESYTZ, VAX1, and LRA respectively being supplied to write control generator 1.5, starter-selector 1.1 and apparent refresh generator 1.2.

Cycle terminator 1.7 responds to interface signal DL, as derived from the remainder of the data processing system to signal that another unit of the data processing system requires access to the memory system, and the synchronized signal at tap 6 of delay line 1.705 to derive signal ALCA which is coupled to allocation control generator 1.8. To these ends, flipflops 1.712 and 1.713, as well as AND gate 1.714, are provided. Flipflop 1.712 includes a clock input terminal 4 connected to be responsive to the signal at output tap 6 of delay line 1.705. Clock input terminal 4 is connected to be responsive to the signal at output tap 6 of delay line 1.705. Clock input terminal 4 of flipflop 1.713 is directly responsive to signal DL which is also supplied to write control generator 1.5. Each of flipflops 1.712 and 1.713 includes a complementary output terminal 6; output terminals 6 of flipflops 1.712 and 1.713 are respectively connected to input terminals 1 and 2 of AND gate 1.714, having output terminal 3 on which is derived signal ALCA that is coupled to allocation control generator 1.8. Because data input terminals 3 of flipflops 1.712 and 1.713 are both grounded, binary 1 signals at clock input terminals 4 of the flipflops result in the derivation of binary 1 signals at output terminals 6 of the flipflops.

Flipflops 1.712 and 1.713 are activated so that binary zero signals are derived at output terminals 6 thereof initially and a predetermined time interval after a binary 1 signal is derived at output terminal 3 of AND gate 1.714. To this end, output terminal 3 of AND gate 1.714 is applied to input terminal 1 of delay line 1.715, having output terminal 2 that is connected to input terminal 1 or NOR gate 1.716, having input terminal 2 responsive to initializing signal Z. Output terminal 3 of NOR gate 1.716 is connected to set input terminals 1 of flipflops 1.712 and 1.713 so that zero value signals are derived at terminal 6 of the flipflops initially and a predetermined time interval after a binary 1 signal is derived at output terminal 3 of AND gate 1.714.

Figure 13:
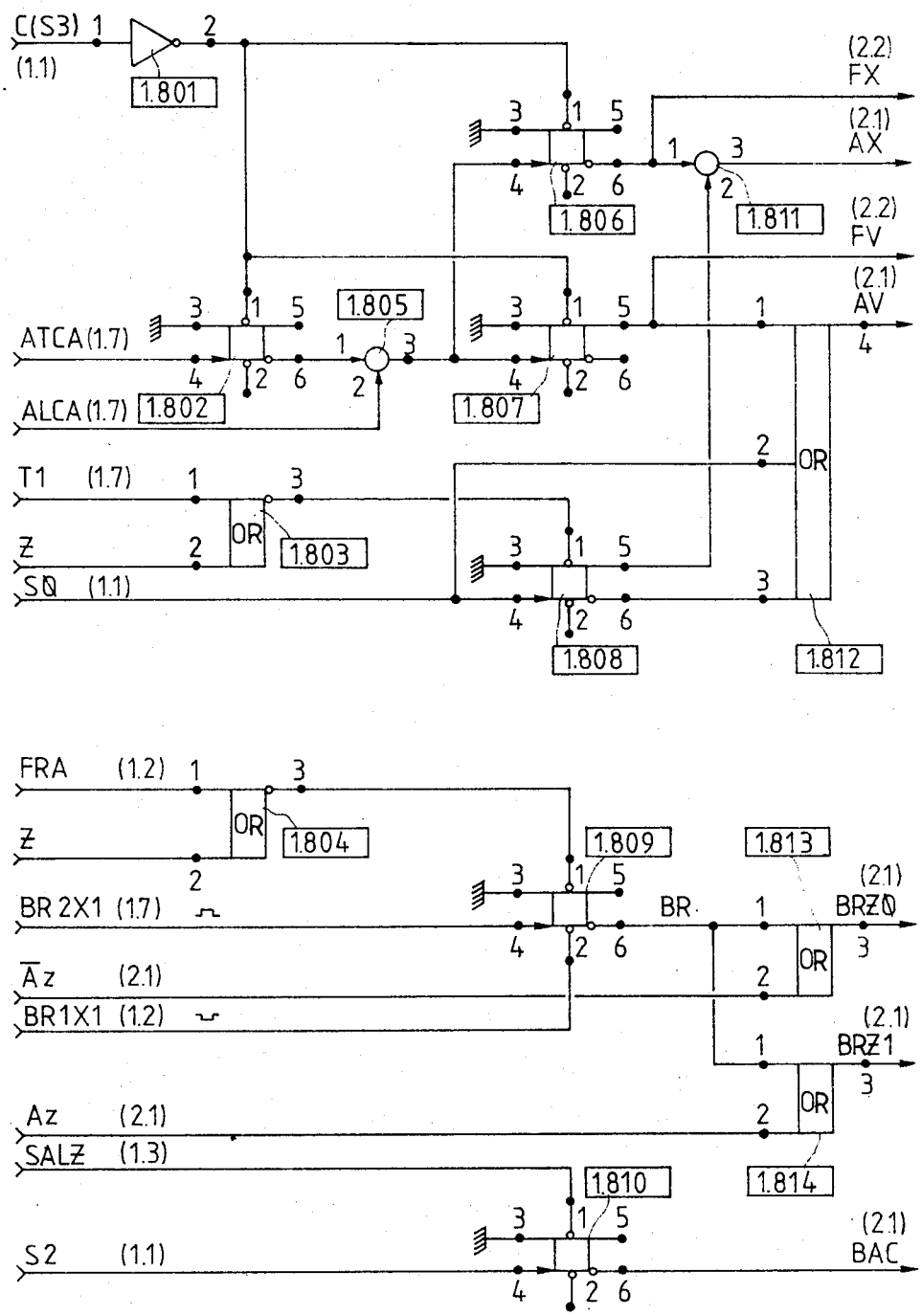
FIG. 13 is a detailed block diagram of an allocation control generator utilized in the control regulator of FIG. 2.

Reference is now made to FIG. 13 of the drawing wherein there is illustrated a block diagram of allocation control generator 1.8. Allocation control generator 1.8 derives instruction signals for address register 2.1 and function register 2.2. The instructions for address register 2.1 and function register 2.2 of allocation register 2 are implemented under the general supervision of instruction control regulator 1 by allocation control generator 1.8, primarily in response to signals derived from selector-starter 1.1 and from cycle terminator 1.7.

Allocation control generator 1.8 includes flipflops 1.802, 1,806 and 1,807, each of which has a set input terminal 1 driven by a signal derived at output terminal 2 of inverter 1.801 having an input terminal 1 responsive to signal C(S3) as derived from selector-starter 1.1 and indicative of a useful cycle. Each of flipflops 1.806 and 1.807 has grounded data terminal 3 and a clock terminal 4 responsive to the signal at output terminal 3 of AND gate 1.805, having input terminals 1 and 2 responsive to the signal at output terminal 6 of flipflop 1.802 and signal ALCA derived from cycle terminator 1.7. Signal ATCA, supplied o the flipflop 1.802 causes the flipflop to be activated so binary 1 and zero signals are derived at output terminals 5 and 6 of the flipflop. The binary 1 signal at output terminal 6 of flipflop 1.805 is coupled through AND gate 1.807 while signal ALCA derived from cycle terminator 1.7 is a binary 1. The binary 1 output of AND gate 1.805 causes binary 1 values for signals FX and FV to be respectively derived at output terminals 6 of flipflops 1.806 and 1.807 while these flipflops are responsive to an inverted replica of signal C(S3), as derived from inverter 1.801.

Signals AX and AV for control of address register 2.1 are derived in response to the states of flipflops 1.806 and 1.807 under the control of signals T1, S0 and Z, respectively derived from cycle terminator 1.7, selector-starter 1.1 and the remainder of the data processing system. To these ends, flipflop 1.808 includes grounded data input terminal 3 and clock input terminal 4, responsive to signal S0, and set input terminal 1 responsive to an output signal of NOR gate 1.803. NOR gate 1.803 includes input terminals 1 and 2 respectively responsive to signals T1 and Z so that the occurrence of either of these signals causes flipflop 1.808 to be activated so binary zero and 1 signals are derived at output terminals 5 and 6 of the flipflop. If NOR gate 1.803 is not responsive to signal T1 or Z while a transition of signal S0 so occurs, binary 1 and zero levels are derived at terminals 5 and 6 of flipflops 1.807 and 1.808 as well as input terminal 2 responsive to signal S0; signal AV is derived at output terminal 4 of OR gate 1.812. To derive signal AX, input terminals 1 and 2 of AND gate 1.811 are respectively connected to output terminals 6 and 5 of flipflops 1.806 and 1.808 so the AND gate derives signal AX at output terminal 3 thereof.

Additional control signals for address register 2.1 are derived by allocation control generator 1.8 in response to signals supplied to flipflops 1.809 and 1.810. Flipflop 1.809 is initialized or re-initialized so that a binary zero level is derived at output terminal 6 thereof in response to a binary 1 value of initializing signal Z or signal FRA as derived from apparent refresh generator 1.2. To these ends, signals FRA and Z are respectively applied to input terminals 1 and 2 of NOR gate 1.804, having output terminal 3 connected to set input terminal 1 of flipflop 1.809. Data input terminal 3 of flipflop 1.809 is grounded while clock input terminal 4 of the flipflop is responsive to signal BR2X1 as derived from cycle terminator 1.7, whereby a binary 1 level is derived from output terminal 6 of the flipflop in response to a binary 1 value of signal BR2X1. A binary 1 signal is also derived from output terminal 6 of flipflop 1.809 in response to signal BR1X1 being derived from apparent refresh generator 1.2, a result achieved by supplying signal BR1X1 to reset input terminal 2 of flipflop 1.809. Signal BR at output terminal 6 of flipflop 1.809 is coupled in parallel to input terminals 1 of OR gates 1.813 and 1.814, having output terminals 3 on which are respectively derived signals BRZ0 and BRZ1 which are coupled to address register 2.1. OR gates 1.813 and 1.814 include input terminals 2 respectively responsive to complementary signals Az and $\overline{Az}$, as derived from address register 2.1; signals Az and $\overline{Az}$ respectively have binary 1 values when memory zones 4.210 and 4.211 are to be enabled.

A further control signal, BAC, is supplied by allocation control generator 1.8 to address register 2.1 by output terminal 6 of flipflop 1.810. Flipflop 1.810 has a grounded data input terminal 3 and a clock input terminal 4 responsive to a signal S2, derived from selector-starter 1.1. Set input terminal 1 of flipflop 1.810 is connected to be responsive to signal SALZ, derived from memory energizer 1.3. In response to signal SALZ, flipflop 1.810 is activated so that a binary zero level is derived at output terminal 6 thereof, while a binary 1 signal is derived at output terminal 6 of the flip-flip in response to a binary 1 value for signal S2.

Figure 21:
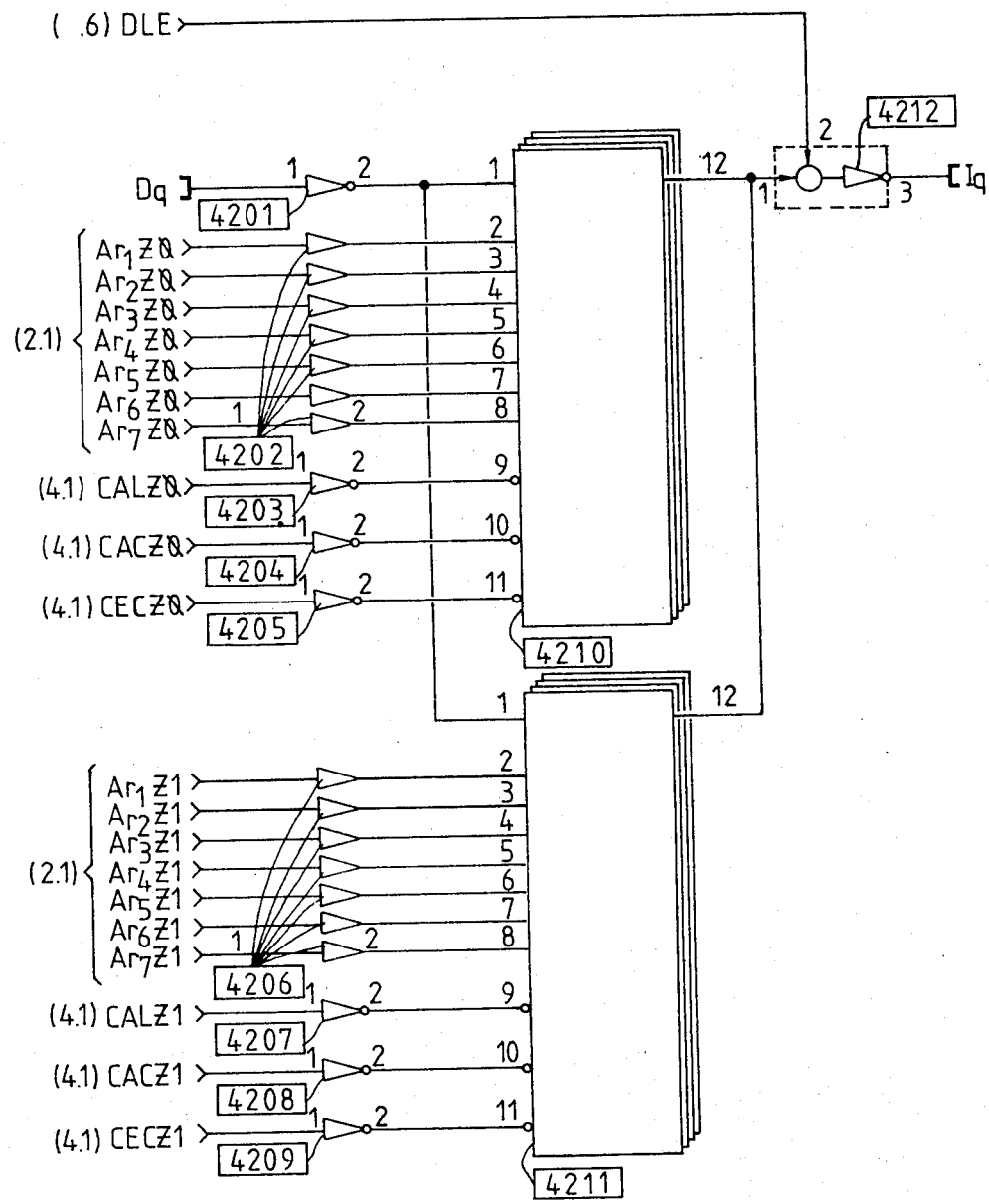
FIG. 21 is a detailed block diagram of a sub-assembly of the memory zones of the storage sub-assembly of FIG. 5.

Before considering address register 2.1, as illustrated in FIG. 14, consideration is given to certain aspects of the memory zone sub-assembly 4.2 as illustrated in FIG. 21. The memory zone sub-assembly 4.2 includes two storage blocks, or zones 4.210 and 4.211, respectively representing sections Z0 and Z1. Cells in memory zone 4.210 are addressed by a 7-bit address signal, $Ar_nZ0$, while addresses in zone 4.211 are addressed by a 7-bit binary signal $Ar_nA1$, where n is every integer from 1 to 7, inclusive. Such a 7-bit address signal enables 128 different cells or bytes in each of memory zones or blocks or zones 4.210 or 4.211. Address signals $Ar_nZ0$ and $Ar_nZ1$ are supplied to memory zones 4.210 and 4.211 at different times, on a multiplexed basis in response to address signals derived from the remainder of the data processing system connected to the memory system of the present invention, or in response to address signals derived during execution of a refresh cycle by the memory system. In response to address signals from the remainder of the data processing system, data are written into, or read from, a selected memory zone 4.210 or 4.211. If, however, a refresh operation is being performed on a specified address in memory zone 4.210 or 4.211, no data are written into the memory zone or read from the memory zone to the data processing unit.

The remainder of the data processing system of which the memory system of the present invention is a part derives a signal ADz, having a binary 1 value when data are to be exchanged between the memory system of the invention and the data processing unit. Accompanying signal ADz is 7-bit address signal ADr for an address in memory zone 4.210 that is to be accessed by the data processing unit or a 7-bit signal ADr+p, indicative of an address in memory zone 4.211 that is to be accessed by the data processing unit.

Address register 2.1, FIG. 14, responds to signals ADz and one of signals ADr or ADr+p to derive one of multi-bit signals $AR_nZ0$ or $AR_nZ1$, respectively applied to one of memory zones 4.210 or or 4.211. In addition, register 2.1 responds to signal ARr during refresh cycles to enable selected addresses in memory zones 4.210 and 4.211 to be refreshed. To this end, address register performs two principle functions, namely: a storage function for signal ADr, or ADr+p; and a multiplexing function between addresses accessed by the remainder of the data processing system and a refresh address as derived from refresh address counter 3.4. To simplify FIG. 14, the circuitry for only one bit of each of signals ADr, ADr+p and ARr in memory zone 4.210 and in memory zone 4.211 is illustrated. It is to be understood, however, that 7-bits are provided for each of these three signals, and that corresponding circuitry is provided in address register 2.1. The circuitry for the remaining bits is identical to the circuitry illustrated for a single bit. Because of this factor, the subscript "n" is omitted from FIG. 14.

Address register 2.1 is responsive to control signals AX, AV, BRZ0, BRZ1, and BAC, as derived from allocation control generator 1.8. Address register 2.1 responds to these control signals and the address signals from the remainder of the data processing system and the refresh address signals derived from the memory system to derive address signals ArZ0 and ArZ1 for memory zones 4.210 and 4.211, respectively. In addition, memory register 2.1 derives signals Az and $\overline{Az}$ which are supplied to masked refresh generator 3.2, mask refresh recorder 3.3, and instruction distributor 4.1 for memory sections 4.2.

To derive signals Az and $\overline{Az}$, signal ADz is applied to input terminal 1 of AND gate 2.101 having input terminal 2 responsive to signal AX, as derived from allocation control generator 1.8. AND gate 2.101 includes an output terminal 3 on which is derived a binary 1 signal in response to a binary 1 signal being supplied to input terminals 1 and 2 thereof. The binary 1 signal at output terminal 3 of AND gate 2.101 is applied in parallel to input terminals 2 of OR gates 2.104 and 2.110. OR gate 2.104 has an output terminal 3 on which is derived a binary 1 signal in response to a binary 1 signal at output terminal 3 of AND gate 2.101. In response to signal AV, as derived from allocation control generator 1.8 having a binary 1 value, the binary 1 signal derived at output terminal 3 of AND gate 2.101 is maintained in a locked condition, at output terminal 3 or OR gate 2.110. To this end, output terminal 3 of OR gate 2.104 is applied to input terminal 1 of AND gate 2.107, having an input terminal 2 responsive to signal AV. AND gate 2.107 includes output terminal 3 that is connected in a feedback loop to input terminal 1 or OR gate 2.104, as well as to input terminal 1 of OR gate 2.110. This particular circuit configuration enables binary 1 signals at output terminal 3 of AND gate 2.101 to be coupled at very high speed to output terminal 3 of OR gate 2.110, and enables the binary 1 level to be maintained as long as a binary 1 level persists for signal AV. The signal at output terminal 3 of OR gate 2.110 is coupled to input terminal 1 of inverter 2.113, having output terminal 2 on which is derived signal $\overline{Az}$, which is coupled to masked refresh generator 3.2 and masked refresh recorder 3.3. Signal Az at output terminal 3 of OR gate 2.110 is coupled in parallel to masked refresh generator 3.2, masked refresh recorder 3.3 and instruction distributor 3.1 for the memory zones in memory sub-assembly 4.

Address signals ADr, and ADr+p, for memory zones 4.210 and 4.211, as derived from the remainder of the data processing system connected to the memory system is applied to a pair of networks that respond almost instantaneously to the address signal bits and maintain them in a locked condition as long as signal AV is being derived from allocation control generator 1.8, provided signal AX is being derived from the allocation control generator. To these ends, signals ADr, and Adr+p, are applied to input terminals 1 of AND gates 2.102 and 2.103, respectively. AND gates 2.102 and 2.103 include input terminals driven in parallel by signal AX. Binary 1 signals derived from output terminal 3 of AND gate 2.102 are applied to input terminals 2 of OR gates 2.105 and 2.111. Similarly, AND gate 2.103 includes an output terminal 3 that is connected in parallel to input terminals 2 of OR gates 2.106 and 2.112. Output terminals 3 of OR gates 2.105 and 2.106 are coupled to input terminals 1 of AND gates 2.108 and 2.109, respectively. AND gates 2.108, and 2.109 have output terminals 3 that are respectively connected to input terminals 1 of OR gates 2.105 and 2.111, as well as to input terminals 1 of OR gates 2.106 and 2.112. Thereby, binary 1 signals are derived at output terminals 3 of OR gates 2.111 and 2.112 in response to binary 1 values for address bits ADr and ADr+p, as long as signal AV has a binary 1 value provided signal AX has a binary 1 value while signals ADr and ADr+p are applied to input terminals 1 of AND gates 2.102 and 2.103.

The signals derived at output terminals 3 or OR gates 211 and 212, indicative of address bits ADr, and ADr+p for memory zones 4.210 and 4.211 as derived from the remainder of the data processing system are time multiplexed with refresh address bits ADr, as derived from refresh address counter 3.4. The time multiplexing is performed in four channel multiplexers 2.114 and 2.115, each of which includes data input terminals 1, 2, 3, and 4, data output terminal 7, and control input terminals 5 and 6. At data output terminals 7 of multiplexers 2.114 and 2.115 are respectively derived signals $Ar_nZ0$ and $Ar_nZ1$, where n is every interger from 1 to 7 inclusive, to designate a particular address bit for a value of n in the circuitry illustrated in FIG. 14.

To these ends, data input terminals 1 of multiplexers 2.114 and 2.115 are driven in parallel by the signal at output terminal 3 of OR gate 2.111, while data input terminals 2 of multiplexers 2.114 and 2.115 are driven in parallel by the signal at output terminal 3 of OR gate 2.112. Data input terminals 3 and 4 of multiplexers 2.114 and 2.115 are driven in parallel by refresh address signal ARr. Control input terminals 5 of multiplexers 2.114 and 2.115 are respectively responsive to signals BRZ0 and BRZ1, both of which are derived from allocation control generator 1.8 and respectively indicate selection of zones 4.710 and 4.711. Control input terminals 6 of multiplexers 2.114 and 2.115 are driven in parallel by signal BAC, derived from allocation control generator 1.8. The two control signals at terminals 5 and 6 of multiplexers 2.114 and 2.115 determine which one of the signals at data terminals 1–4 of the multiplexers is coupled to output terminal 7 of the multiplexer. A binary 1 value for signal BRZ0 causes the signal at data input terminal 1 of multiplexer 2.114 to be coupled to output terminal 7 of multiplexer 2.114, while a binary 1 value for signal BRZ1 at input terminal 5 of the multiplexer 2.115 causes the signal at data terminal 2 of multiplexer 2.115 to be coupled to output terminal 7 of the multiplexer 2.115. A binary 1 value for signal BAC, coupled in parallel to input terminal 6 of multiplexer 2.114 and 2.115, causes the signals at data input terminals 3 and 4 of the multiplexers to be supplied to output terminals 7 of the multiplexers 2.114 and 2.115, respectively applied as address bits for memory zones 4.210 and 4.211 to driver amplifiers 4.202 and 4.206.

Figure 15:
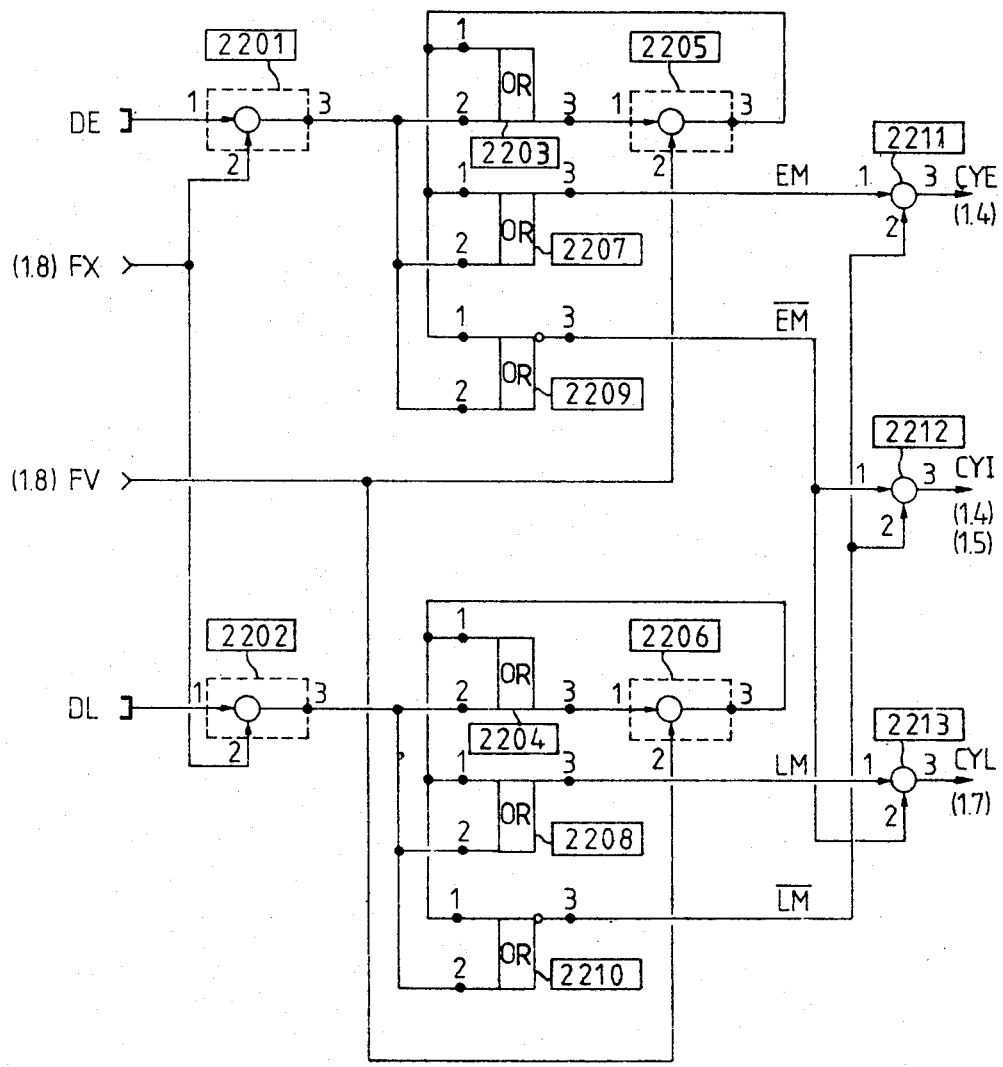
FIG. 15 is a detailed block diagram of a function register employed in the allocation register of FIG. 3.

Reference is now made to FIG. 15 of the drawing wherein there is illustrated a detailed block diagram of function register 2.2. Function register 2.2 responds to and stores write sequence command signals DE and read sequence command signals DL supplied to the memory system by the remainder of the data processing system when signals are to be written into the memory from the data processing system and when signals are to be read from the memory to the data processing unit.

Write sequence signals DE and read sequence signals DL are locked in function register 2.2 by circuitry similar to the locking circuitry employed in address register 2.1, under the control of signals FX and FV, both of which are derived from allocation control generator 1.8. In response to the signals stored by the locking circuits, function register 2.2 derives condition signals CYE, CYI and CYL which are supplied to writer 1.4, writer control generator 1.5 and cycle terminator 1.7.

Write sequence command signal DE and read sequence command signal DL, as derived from the remainder of the data processing system, are respectively applied to input terminals 1 of AND gates 2.201 and 2.202, each having an input terminal 2 driven in parallel by signal FX, as derived from allocation control generator 1.8. Binary 1 signals at output terminals 3 of AND gates 2.201 and 2.202 are supplied to separate locking circuits, which are driven in parallel by signal FV, derived from allocation control generator 1.8. The locking circuit responsive to signal DE derives complementary signals EM and $\overline{EM}$ while the locking circuit responsive to signal DL derives complementary signals LM and $\overline{LM}$. The locking circuit responsive to the signal at output terminal 3 of AND gate 2.201 includes OR gate 2.203, having input terminal 2 connected to output terminal 3 of AND gate 2.201. OR gate 2.203 includes output terminal 3, connected to input terminal 1 of AND gate 2.205 having input terminal 2 responsive to signal FV. Output terminal 3 of AND gate 2.205 is connected in parallel to input terminals 1 of OR gates 2.203, 2.207 and NOR gate 2.209, each having an input terminal 2 responsive to the signal at output terminal 3 of AND gate 2.201. Thereby, gates 2.207 and 2.209 respectively derive signals EM and $\overline{EM}$ in response to the value of signal DE while signal FX has a binary 1 value for the duration of signal FV having a binary 1 value. The locking circuit responsive to signal DL includes gates 2.202, 2.204, 2.206, 2.208 and 2.210 which are connected to be responsive to signals DL, FV and FX in exactly the same manner as the locking circuit which is responsive to signals DE, FX, and FV. Thereby, complementary signals LM and $\overline{LM}$ are respectively derived from output terminals 3 of NOR gates 2.208 and 2.10. The locking circuits responsive to signals DE and DL include no capacitor charging networks and thus derive output signals EM, $\overline{EM}$, LM, and $\overline{LM}$ with a minimum delay time.

Signals EM, $\overline{EM}$, LM and $\overline{LM}$ are combined in a logic network including AND gates 2.211, 2.212 and 2.213; AND gates 2.211, 2.212 and 2.213 have output terminals 3 on which are respectively derived signals CYE, CYI and CYL. Signal CYE is derived when a write sequence is commanded and a read sequence is not commanded, as indicated by binary 1 and zero values for signals DE and DL, by virtue of signals EM and $\overline{LM}$ being coupled to input terminals 1 and 2 of gate 2.211. Signal CYE at output terminal 3 of AND gate 2.211 is supplied to writer 1.4. AND gate 2.212 derives signal CYI at output terminal 3 thereof; signal CYI is coupled to writer 1.4 and write control generator 1.5 when neither a write sequence nor a read sequence has been commanded, by virtue of signals $\overline{EM}$ and $\overline{LM}$ being coupled to input terminasl 1 and 2 of AND gate 2.212. AND gate 2.213 derives signal CYL at output terminal 3 thereof, which signal is supplied to cycle terminator 1.7 when a read sequence is requested to the exclusion of a write sequence by the data processor, by virtue of signals LM and $\overline{EM}$ coupled to input terminals 1 and 2 of the AND gate.

Figure 16:
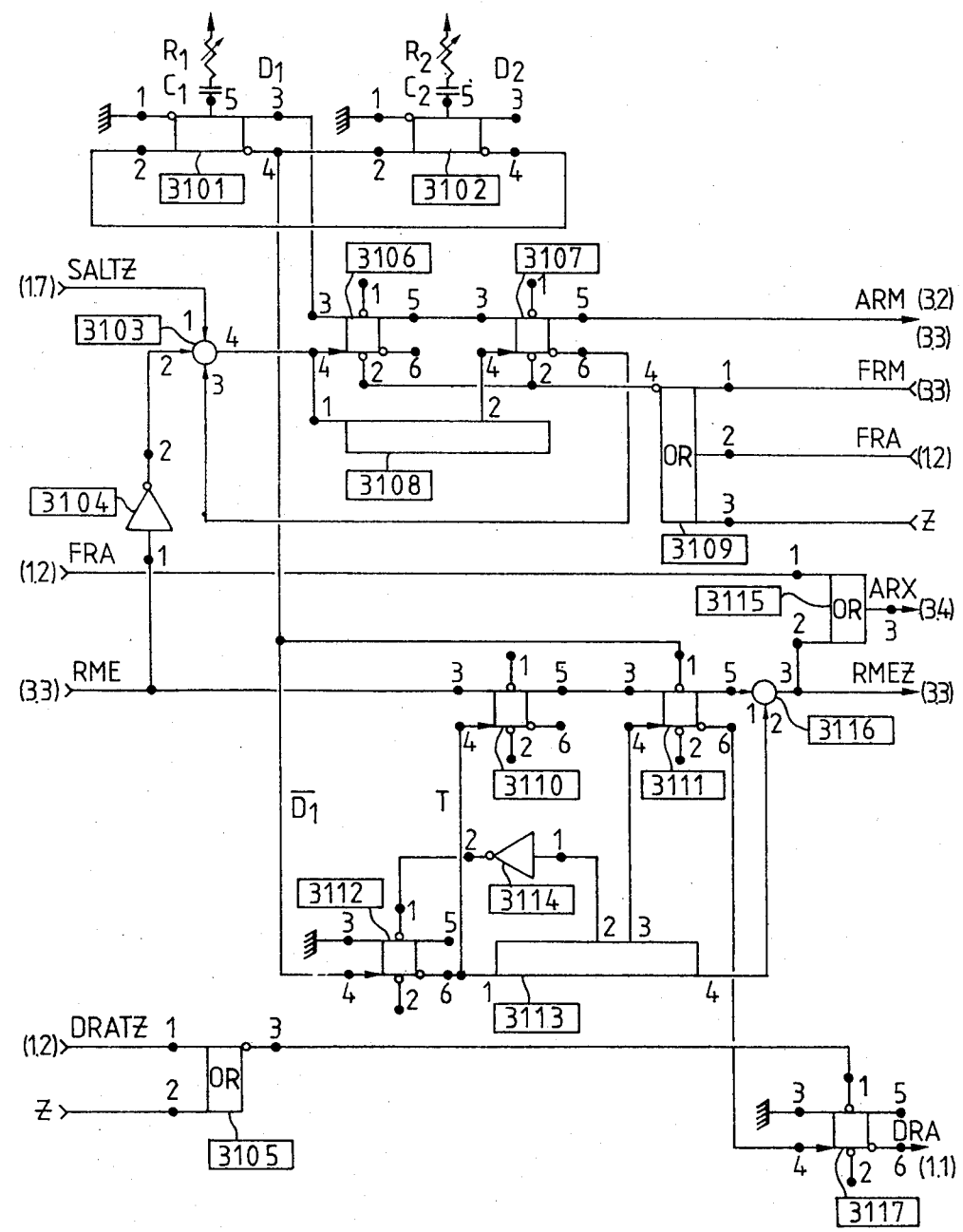
FIG. 16 is a detailed block diagram of a refresh energizer employed in the refresh regulator of FIG. 4.

Reference is now made to FIG. 16 of the drawing wherein there is illustrated a detailed block diagram of refresh energizer 3.1. Refresh energizer 3.1 includes a clock source comprising cascaded monostables 3.101 and 3.102, connected in a positive feedback network so that output terminal 4 of monostable 3.102 is connected to clock input terminal 2 of monostable 3.101 and output terminal 4 of monostable 3.101 is connected to clock input terminal 2 of monostable 3.102. Data input terminals 1 of monostables 3.101 and 3.102 are connected to ground, while input terminals 5 of the monostables are connected to two different series resistance capacitance networks, which establish the oscillation interval of the clock source. Complementary output signals $\overline{D1}$ and D1 are derived from terminals 3 and 4 of monostable 3.101, respectively.

Timing signal D1 is coupled from output terminal 3 of monostable 3.101 to data input terminal 3 of flipflop 3.106, where the timing signal is stored in response to a positive going transition at clock input terminal 4 of flipflop 3.106. Clock input terminal 4 of flipflop 3.106 is connected to output terminal 4 of AND gate 3.103 having input terminals 1 and 2 respectively responsive to signal $\overline{SALT}$, derived from cycle terminator 1.7 and signal $\overline{RME}$ derived from output terminal 2 of inverter 3.104, having input terminal 1 responsive to signal RME. Signal RME, derived from masked refreshed recorder 3.3, has a binary 1 value when masked refresh has been performed, whereby AND gate 3.103 can be enabled only when a masked refresh has not been performed. AND gate 3.103 also includes input terminal 3, responsive to the complementary signal at output terminal 6 of flipflop 3.107.

Flipflops 3.106 and 3.107 are cascaded with each other, by connecting output terminal 5 of the flipflop 3.106 to data input terminal 3 of the flip-flop 3.107. Clock input terminal 4 of flipflop terminal 3.107 is connected to tap 2 of delay line 3.108 having input terminal 1 connected to be responsive to the signal at output terminal 4 of AND gate 3.103. Thereby, a binary 1 signal is applied to clock input terminal 4 of flipflop 3.107 a predetermined time interval, determined by the delay time of delay line 3.108, after a binary 1 signal is applied to clock input terminal 4 of flipflop 3.106. Thereby, the signal at output terminal 6 of flipflop 3.107 is the complement of the signal at output terminal 5 of flipflop 3.106 at the time a binary 1 signal is applied by tap 2 of delay line 3.108 to clock input terminal 4 of flipflop 3.107. The signal at output terminal 6 of flipflop 3.107 thus has a binary 1 value to indicate that there is no masked refresh authorization, while signal ARM at output terminal 5 of the flipflop indicates that a masked refresh has been authorized; signal ARM is fed from output terminal 5 of flipflop 3.107 to input terminal 1 of AND gate 3.201 of masked refresh generator 3.2 and to input terminal 2 of AND gate 3.301 of masked refresh recorder 3.3. Flipflops 3.106 and 3.107 include reset input terminals 2 which are driven in parallel by the signal at output terminal 4 of NOR gate 3.109, having input terminals 1, 2 and 3 respectively responsive to (1) masked refresh completion signal FRM, derived from output terminal 4 of AND gate 3.309 of masked refresh recorder 3.3, (2) apparent refresh completion signal FRA, derived from output terminal 2 of inverter 1.209 of apparent refresh generator 1.2, and (3) initializing signal Z. Thereby, flip-flops 3.106 and 3.107 are activated to the reset state wherein binary zero levels are derived from output terminals 5 thereof in response to a binary 1 value for any of signals FRM, FRA or Z.

Signal $\overline{D1}$ derived from output terminal 4 of monostable 3.101 is combined with signal RME to control the derivation of signal RMEZ supplied to masked refresh recorder 3.3 and signal DRA supplied to selector-starter 1.1. To these ends, output terminal 4 of monostable 3.101 is connected to clock input terminal 4 of flipflop 3.112 having a complementary output terminal 6 that is connected in parallel to input terminal 1 of delay line 3.113 and clock input terminal 4 of flipflop 3.110. Data input terminal 3 of flipflop 3.110 is connected to be responsive to signal RME indicative of a masked refresh operation having been performed, as derived from masked refresh recorder 3.3. Flipflops 3.110 and 3.111 are cascaded with each other, whereby output terminal 5 of flipflop 3.110 is connected to data input terminal 3 of flipflop 3.111 having clock input terminal 4 connected to output tap 3 of delay line 3.113. Output tap 2 of delay line 3.113, between input terminal 1 and tap 3 of the delay line, is connected to input terminal 1 of inverter 3.114, having output terminal 2 connected to set input terminal 1 of flipflop 3.112. Set input terminal 1 of flipflop 3.111 is connected to output terminal 4 of monostable 3.101. Output terminal 5 of flipflop 3.111 and tap 4 of delay line 3.113 are respectively connected to input terminals 1 of AND gate 3.116, having an output terminal 3 on which is derived signal RMEZ that is supplied to masked refresh recorder 3.3.

In response to a positive going transition of signal $\overline{D1}$, flipflop 3.112 is reset to zero whereby a binary 1 signal is supplied by the flipflop to input terminal 1 of delay line 3.113. Subsequently, at a time determined by the delay time of delay line 3.113 between input terminal 1 and tap 2 thereof, flipflop 3.112 is returned to the normal binary 1 state thereof, whereby a binary zero level is derived at output terminal 6 of flipflop 3.112. In response to a binary 1 signal at output terminal 6 of flipflop 3.112, flipflop 3.110 is activated to a binary 1 state, provided signal RME has a binary 1 value. Subsequently, at a time determined by the delay time between terminal 1 and tap 3 of delay line 3.113, flipflop 3.111 is activated to a binary 1 state, in which binary 1 and zero signals are derived from output terminals 5 and 6 thereof. The binary 1 signal at output terminal 5 of flipflop 3.111 is subsequently coupled through AND gate 3.116, at a time determined by the delay time of delay line 3.113 between taps 3 and 4 thereof. Thereby, signal RMEZ is derived in response to a signal RME at a precise time relative to clock pulses derived by the clock source including monostables 3.101 and 3.102.

In response to either signal FRA, indicative of an apparent refresh cycle being completed, derived at output terminal 2 of inverter 1.209 of apparent refresh generator 1.2 or signal RME, indicative of a masked refresh cycle having been executed, having a binary 1 value, signal ARX is derived. Signal ARX is supplied to refresh address counter 3.4 to control switching of instructions to refresh addresses of memory zones 4.210 and 4.211. To these ends, OR gate 3.115 is provided and includes input terminals 1 and 2, respectively responsive to signals FRA and RMEZ. OR gate 3.115 includes output terminal 3 on which is derived a signal ARX.

Control signal DRA for input terminal 1 of AND gate 1.104 of selector-starter 1.1 is derived in response to a binary 1 signal being derived at output terminal 6 of flipflop 3.111, and thus is a function of the value of signal RME, indicative of whether a masked refresh has been executed. To these ends, terminal 6 of flipflop 3.111 is connected to clock input terminal 4 of flipflop 3.117 having a grounded data input terminal 3. Flipflop 3.117 has a set input terminal 1 connected to output terminal 3 of NOR gate 3.105 having input terminals 1 and 2 respectively responsive to signal DRATZ, derived from output terminal 3 of OR gate 1.205 of apparent refresh generator 1.2, and to initializing signal Z. Flipflop 3.117 includes output terminal 6 on which is derived signal DRA that is coupled to input terminal 1 of AND gate 1.104, whereby a binary 1 value of signal DRA signals to selector-starter 1.1 that it can commence operation. Signal DRA has a binary 1 value in response to a binary 1 value of signal Z or DRATZ, or the output terminal 6 of 3.111 having a binary 1 value.

Figure 17:
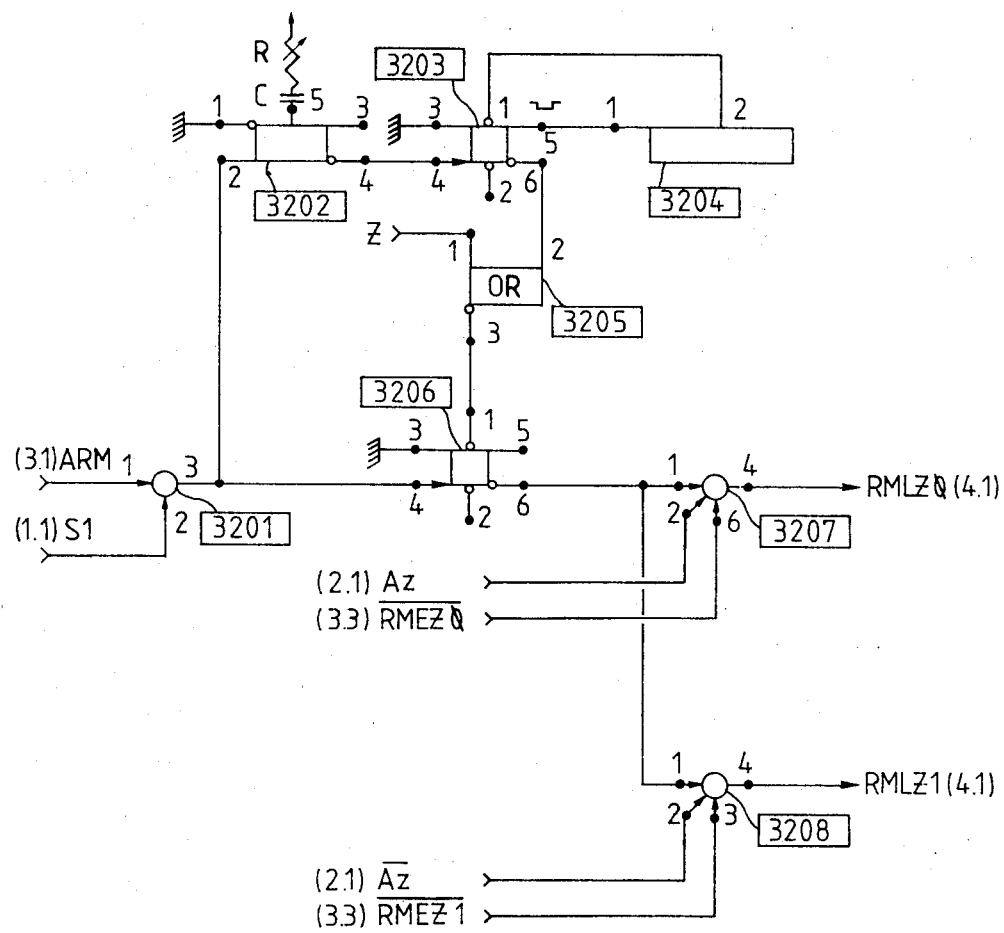
FIG. 17 is a detailed block diagram of a masked refresh generator employed in the refresh regulator of FIG. 4.

Reference is now made to FIG. 17 of the drawing, a detailed block diagram of masked refresh generator 3.2. Masked refresh generator 3.2 responds to signal ARM which signals authorization of a masked refresh cycle, signals Az and $\overline{Az}$ which respectively indicate that zones 4.210 and 4.211 of the memory sub-assembly are to be enabled, and signals RMEZ0 and RMEZ1 which respectively indicate that no masked refresh is being performed in zones 4.210 and 4.211 to derive signals $\overline{RMLZ0}$ and RMLZ1 which respectively command the starting of masked refresh cycles in zones 4.210 and 4.211.

To these ends, signal ARM and synchronizing signal S1 are respectively supplied by refresh energizer 3.1 and selector-starter 1.1 to input terminals 1 and 2 of AND gate 3.201 having output terminal 3 that is connected to clock input terminal 4 of flip-flop 3.206 having grounded data input terminal 3. A binary 1 signal at clock input terminal 4 of flipflop 3.206 causes a binary 1 signal to be derived at output terminal 6 of the flipflop. The binary 1 level at output terminal 6 of flipflop 3.206 persists for a predetermined time interval or until an initializing signal Z occurs. To these ends, output terminal 3 of AND gate 3.201 is connected to clock input terminal 2 of monostable 3.202, having a grounded data input terminal and an input terminal 5 connected to series resistance-capacitance network which determines the time constant of the monostable. Output terminal 4 of monostable 3.202 is connected to clock input terminal 4 of flipflop 3.203 having a grounded data input terminal 3 and output terminal 5 connected to input terminal 1 of delay line 3.204 having output tap 2 connected to set input terminal 1 of the flipflop. Complementary output terminal 6 of flipflop 3.203 is connected to input terminal 1 of NOR gate 3.205 having input terminal 1 responsive to initializing signal Z. Output terminal 3 or NOR gate 3.205 is connected to set input terminal of flipflop 3.206 whereby the flip-flop is activated so a binary zero level is derived from output terminal 6 thereof, in response to initializing signal Z or a predetermined time after the flip-flop was activated into a state wherein a binary 1 is derived from output terminal 6 thereof.

The precisely timed signal at output terminal 6 of flipflop 3.206 is coupled in parallel to input terminals 1 of AND gates 3.207 and 3.208. Input terminals 2 of AND gates 3.207 and 3.208 are respectively responsive to signals Az and $\overline{Az}$, respectively signaling that zones 4.210 and 4.211 are to be enabled. Input terminals 3 of AND gates 3.207 and 3.208 are respectively responsive to signals $\overline{RMEZ0}$ and $\overline{RMEZ1}$, which respectively indicate that no masked refresh operation is being performed in either zone 4.210 or 4.211. In response to a binary 1 signal being supplied to each of input terminals 1, 2 and 3 of AND gate 3,207, the AND gate derives a binary 1 level for signal RMLZ0, at output terminal 4 of the AND gate. Similarly, AND gate 3.208 derives a binary 1 level for signal RMLZ1 at output terminal 4 of the AND gate, in response to input terminals 1, 2 and 3 of the AND gate being responsive to binary 1 signals. Signals RMLZ0 and RMLZ1 are respectively applied to OR gates 4.108 and 4.109 of command distributor 4.1 for memory zones 4.210 and 4.211. Signals RMLZ0 and RMLZ1 resepctively indicate that masked refresh cycles are to be initiated in zones 4.210 and 4.211.

Figure 18:
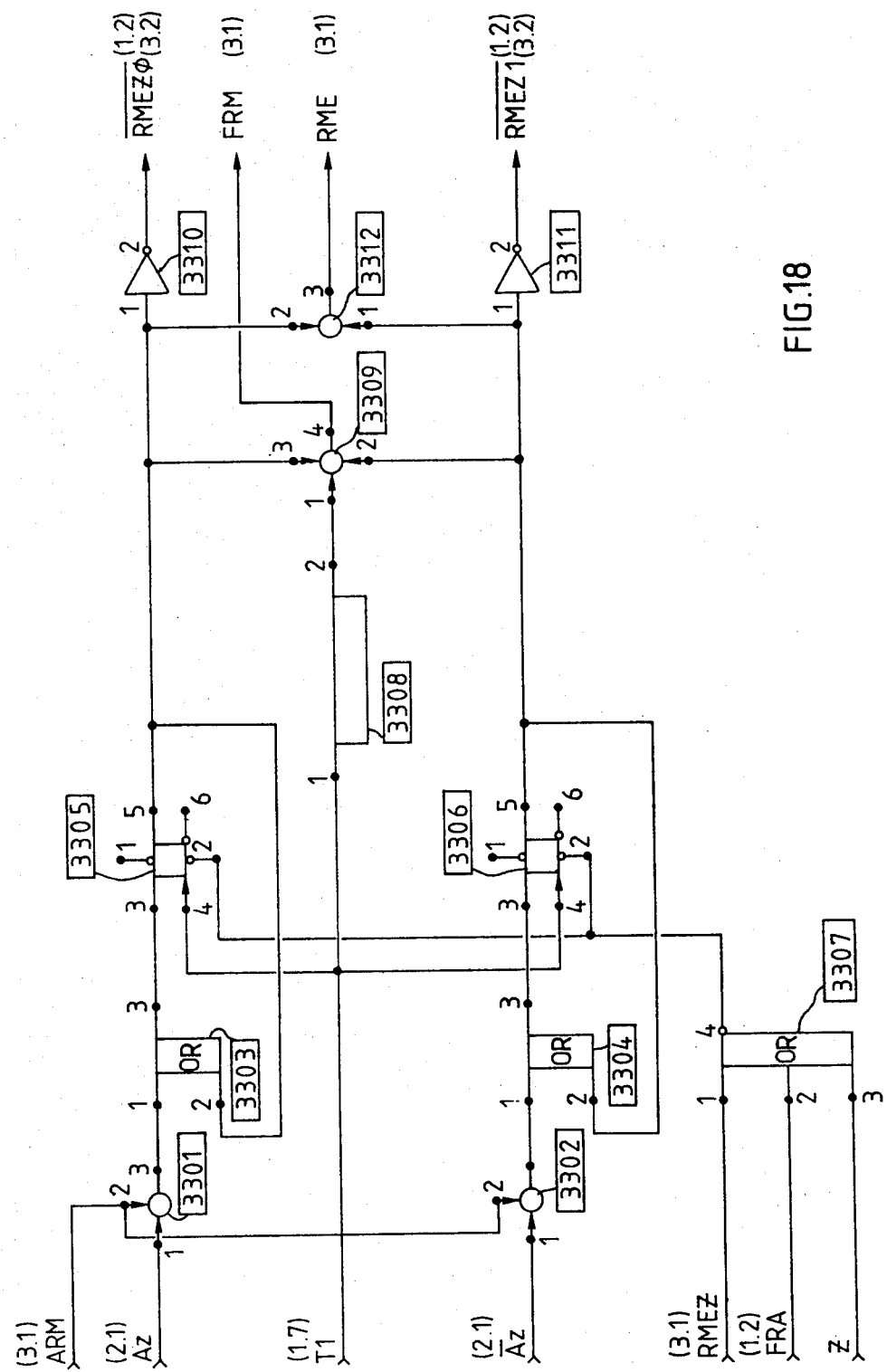
FIG. 18 is a detailed block diagram of a masked refresh recorder in the refresh regulator of FIG. 4.

Reference is now made to FIG. 18 of the drawing wherein there is illustrated a detailed block diagram of masked refresh recorder 3.3 which verifies execution of masked refresh cycles in one of memory zones 4.210 or 4.211. To this end, masked refresh recorder 3.3 responds to (1) signals Az and $\overline{Az}$, respectively indicative of selection of zones 4.210 and 4.211 and derived from address register 2.1, (2) signal ARM indicative of a masked refresh cycle being authorized, as derived from refresh energizer 3.1, (3) signal RMEZ, indicative of a zero reset of a signal indicative of a masked refresh cycle having been executed, as derived from refresh energizer 3.1, (4) signal FRA indicative of an apparent refresh cycle being completed as derived from apparent refresh generator 1.2, (5) signal T1 derived from cycle terminator 1.7, and (6) initializing signal Z. Masked refresh recorder 3.3 responds to these signals to derive signal FRM, indicative of a masked refresh cycle having been terminated, signal RME indicative of a masked refresh cycle being executed, as well as signals $\overline{RMEZ0}$, indicative of no masked refresh being performed in memory zone 4.210 and $\overline{RMEZ1}$, indicative of no masked refresh being performed in memory zone 4.211.

The apparatus of masked refresh recorder 3.3 includes AND gates 3.301 and 3.302, having input terminals 1 respectively responsive to signals Az and $\overline{Az}$, and input terminals 2, driven in parallel by signal ARM. AND gates 3.301 and 3.302 include output terminals 3, respectively connected to input terminals 1 of OR gates 3.303 and 3.304. Thereby, OR gate 3.303 derives a binary 1 signal on output terminal 3 thereof in response to signals ARM and Az simultaneously having binary 1 values, while a binary 1 signal is derived from OR gate 3.304 on output terminal 3 thereof in response to signals $\overline{Az}$ and ARM simultanously having binary 1 values.

The signals derived at output terminals 3 of OR gates 3.303 and 3.304 are applied to data input terminals 3 of flipflops 3.305 and 3.306. Flipflops 3.305 and 3.306 include clock input terminals 4 driven in parallel by signal T1 derived from delay line 1.705 of cycle terminator 1.7. Output terminals 5 of flip-flops 3.305 and 3.306 are respectively connected to input terminals 2 of OR gates 3.303 and 3.304. Thereby, flipflops 3.305 and 3.306 remain locked in a state wherein binary 1 signals are derived from output terminals 5 thereof until the flipflops are reset.

Flipflops 3.305 and 3.306 are reset in response to any of signals RMEZ, FRA, or Z having a binary 1 value. Signals RMEZ and FRA have binary 1 values to indicate that a masked refresh cycle has been executed and that an apparent refresh cycle has been completed; signal Z is derived when the memory system is initialized. Signals RMEZ and FRA are coupled to input terminals 1 and 2 of NOR gate 3.307 from output terminal 3 of AND gate 3.116 and output terminal 2 of inverter 1.209 while signal Z is supplied to input terminal 3 of the NOR gate. NOR gate 3.307 includes output terminal 4 that is connected to reset input terminals 2 of flip-flops 3.305 and 3.306.

The signals at output terminals 5 of flipflops 3.305 and 3.306 thus are respectively indicative of masked refresh operations being performed in memory zones 4.210 and 4.211. The signals at terminals 5 of flipflops 3.305 and 3.306 are respectively coupled to input terminals of inverters 3.310 and 3.311. Inverters 3.310 and 3.311 have output terminals 2 on which are respectively derived signals $\overline{RMEZ0}$ and $\overline{RMEZ1}$. Signals $\overline{RMEZ0}$ and $\overline{RMEZ1}$ are both applied to apparent refresh generator 1.2 and masked refresh generator 3.2.

To derive signals RFM and RME, the signals at output terminals 5 of flipflops 3.305 and 3.306 are combined in AND gates 3.309 and 3.312 such that signal 3.312 is derived from output terminal 3 of AND gate 3.312 prior to derivation of signal RFM at output terminal 4 of AND gate 3.309 when the signals at output terminals 5 of flipflops 3.305 and 3.306 both have refresh energizer 3.1. On output terminals 3, 4 and 5 of counter 3.402 are respectively derived refresh address signals $AR_0$, $AR_1$ and $AR_2$, while counter 3.401 derives signals $AR_3$, $AR_4$, $AR_5$ and $AR_6$ on output terminals 2, 3, 4 and 5 respectively. The inverted replica of signal ARX applied to input terminal 1 of counter 3.401 causes the sequential derivation of signals $AR_0$-$AR_6$ in reverse order, whereby signal $AR_6$ is derived first, and signal $AR_0$ is derived last.

Figure 20:
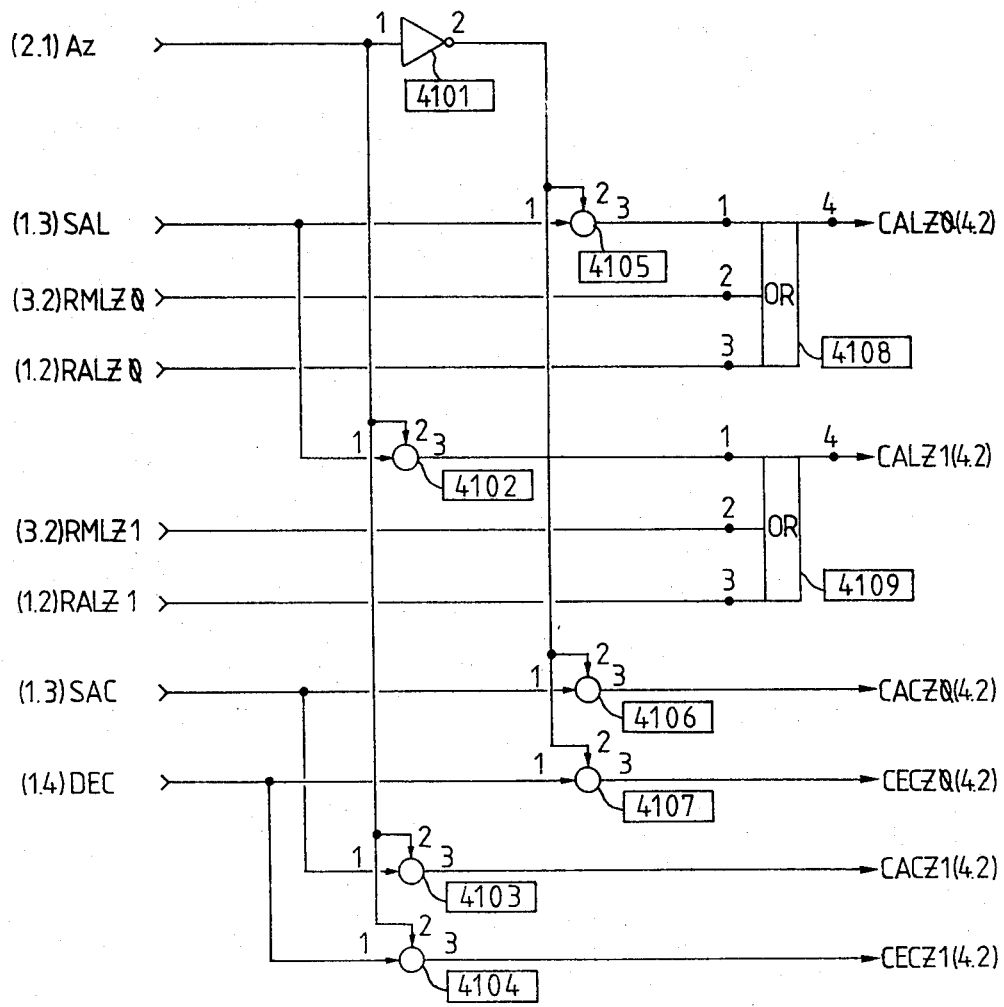
FIG. 20 is a detailed block diagram of a memory zone control distributor employed in the storage sub-assembly of FIG. 5.

Reference is now made to FIG. 20, a detailed block diagram of instruction distributor 4.1 for memory zones 4.210 and 4.211. Instruction distributor 4.1 controls activation of row and column addresses in a selected one of memory zlones 4.210 or 4.211. Instruction distributor 4.1 responds to zone select signal $\overline{Az}$, indicative of section 4.211 being selected, as derived from address register 2.1. Instruction distributor 4.1 also responds to signals SAL and SAC, respectively, indicative of row address and column address selection in memory zone 4.210 and 4.211, as derived from memory energizer 4.3, as well as write control signal DEC, derived from output terminal 5 of flipflop 1.414 of writer 1.4. Instruction distributor 4.1 is also responsive to signals MRLZ0, and MRLZ1, derived from masked refresh generator 3.2 and respectively indicative of masked refresh cycles being initiated in zones 4.210 and 4.211. Instruction distributor 4.1 is further responsive to signals RALZ0 and RALZ1, derived from apparent refresh generator 1.2 and respectively indicative of apparent refresh cycles being initiated in memory zones 4.210 and 4.211.

To these ends, instruction distributor 4.1 includes AND gates 4.102, 4.103 and 4.104, each of which has an input terminal 2, driven in parallel by signal $\overline{Az}$. AND gates 4.102, 4.103 and 4.104 include binary values. To these ends, output terminals 5 of flipflops 3.305 and 3.306 are respectively connected to input terminals 2 and 1 of AND gate 3.312 having output terminal 3 on which is derived signal RME which is indicative of a masked refresh cycle being performed and is coupled to input terminal 1 of inverter 3.104 and data input terminal 3 of flipflop 3.110 of refresh generator 3.111. Terminals 5 of flipflops 3.305 and 3.306 are respectively connected to input terminals 3 and 2 of AND gate 3.309 having input terminal 1 responsive to a delayed replica of signal T1, as derived from output terminal 2 of delay line 3.301, having input terminal 1 responsive to timing signal T1 derived from delay line 1.705. AND gate 3.309 includes output terminal 4, on which is derived signal FRM that is coupled to NOR gate 1.309 of refresh generator 3.1.

Figure 19:
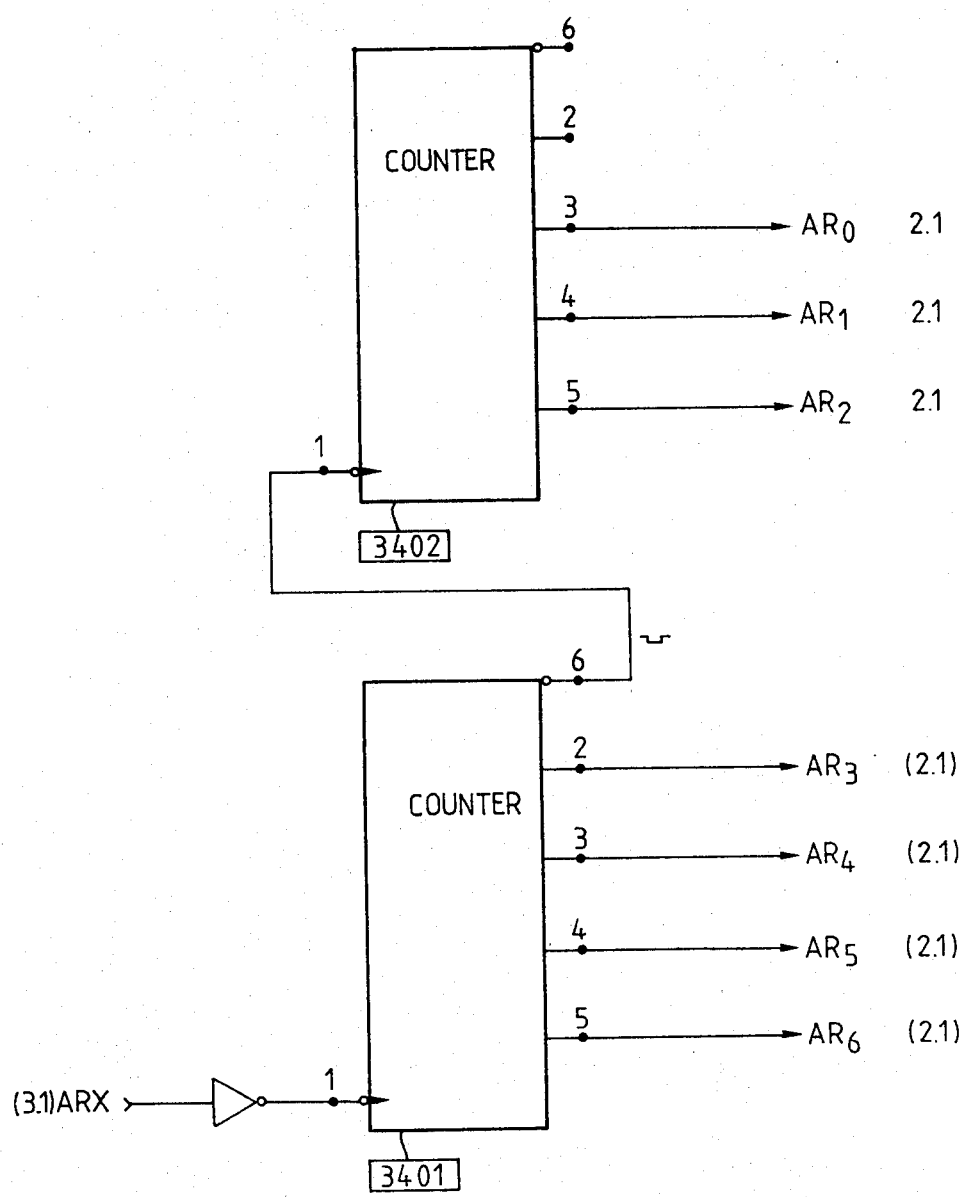
FIG. 19 is a detailed block diagram of a refresh address counter employed in the refresh regulator of FIG. 4.

Reference is now made to FIG. 19 of the drawing wherein there is illustrated a detailed block diagram of refresh address counter 3.4 which derives refresh address signal AR that is supplied to address register 2.1 under control of progression signal ARX, derived from refresh energizer 3.1. Refresh address counter 3.4 derives 7 refresh signals $AR_0$-$AR_6$ in sequence. Signals $AR_0$-$AR_6$ are thereby applied in sequence to the 7 address inputs of one of memory zones 4.210 or 4.211, under control of address register 2.1 and distributor 4.1 for instructions applied to the zones of memory sub-assembly 4.2.

Refresh address counter 3.4 comprises series connected counters 3.401 and 3.402, connected with each other so that output terminal 6 of counter 3.401 is connected to input terminal 1 of counter 3.402. Counter 3.401 includes input terminal 1 responsive to an inverted replica of signal ARX, as derived from input terminals 1, respectively responsive to signals SAL, SAC and DEC. AND gates 4.103 and 4.104 include output terminals 3 on which are derived signals CACZ1 and CECZ1, which are applied to memory zone 4.211 to control addressing of columns within zone 4.211 and activation of write operations in zone 4.211 respectively. AND gate 4.102 includes output terminal 3 connected to input terminal 1 of OR gate 4.109, having input terminals 2 and 3 respectively responsive to signals RMLZ1 and RALZ1. OR gate 4.109 includes output terminal 4 on which is derived signal CALZ1, which is applied to zone 4.211 to activate row addresses in zone 4.211.

Similar circuitry is provided for control of addresses in memory zone 4.210. In particular, signal $\overline{Az}$ is complemented by being applied to input terminal 1 of inverter 4.101 having output terminal 2 which is connected to supply signal Az in parallel to input terminals 2 of AND gates 4.105, 4.106 and 4.107. AND gates 4.106 and 4.107 include input terminals 1 respectively responsive to signals SAC and DEC. AND gates 4.106 and 4.107 include output terminals 3 on which are respectively derived signals CACO and CECO, that are applied to memory zone 4.210 to control addressing of columns in zone 4.210 and to control write activation in zone 4.210, respectively. AND gate 4.105 includes input terminal 1 responsive to row selection signal SAL, as well as output terminal 3 that is connected to input terminal 1 or OR gate 4.108. OR gate 4.108 includes input terminals 2 and 3 respectively responsive to signals RMLZ0 and RALZ0. OR gate 4.108 includes output terminal 4 on which is derived signal CALZ0 that is supplied to memory zone 4.210 to activate addressing of rows in zone 4.210.

Reference is now made to FIG. 21 of the drawings wherein there is illustrated a detailed block diagram of memory sub-assembly section 4.2 which includes random access, MOS, dynamic memory zones 4.210 and 4.211 that require refresh operations. Each of memory zones 4.210 and 4.211 includes data input terminals 1 as well as row address terminals 2-8. In addition, memory zones 4.210 and 4.211 include row address input terminals 9, column address input terminals 10, and write address input terminals 11. Memory zones 4.210 and 4.211 include output terminals 12 on which are derived signals from rows and columns of the memory zones that are addressed during a read operation.

Input terminals 1 of memory zones 4.210 and 4.211 are connected to output terminal 2 of inverter 4.201, having input terminal 1 responsive to data bit Dq, derived from the remainder of the data processing system and indicative of a read operation for memory zone 4.210 or 4.211. Address terminals 2-8 of memory zone 4.210 are responsive to memory signals from 7 different driver amplifiers 4.202, in turn having input terminals 1 responsive to signals $Ar_1Z0-Ar_7Z0$, as derived from 7 different multiplexers of address register 2.1, similar to multiplexer 2.114. Similarly, address input terminals 2-8 of memory zone 4.211 are responsive to signals to output terminals 2 of 7 different driver amplifiers 4.206. Driver amplifiers 4.206 have input terminals 1 responsive to 7 different row address signals, $Ar_1Z1-Ar_7Z1$, as derived from 7 different multiplexers of address register 2.1 similar to multiplexer 2.115. Input terminals 9, 10 and 11 of memory zone 4.210 are respectively responsive to signals derived at output terminals 2 of inverters 4.203, 4.204 and 4.205. Inverters 4.203, 4.204 and 4.205 have input terminals 1 respectively responsive to signals CALZ0, CACZ0 and CECZ0, as derived from address distributor 4.1 and respectively indicative of row address control, column address control and write address control. Input terminals 9, 10 and 11 are similarly responsive to signals derived at output terminals 2 of inverters 4.207, 4.208 and 4.209. Inverters 4.207, 4.208 and 4.209 include input terminals 1 respectively responsive to signals CALZ1, CACZ1 and CECZ1, as derived from distributor 4.1 and respectively indicative of row address control for zone 4.211, column address control for 4.211 and write address control for zone 4.211.

Signals read from the selected memory zone 4.210 or 4.211 are combined at input terminal 1 of NAND gate 4.212, having input terminal 2 responsive to signal DLE, as derived from AND gate 1.606 of reader 1.6. NAND gate 4.212 includes output terminal 3 which is connected to the remainder of the data processing system to supply a signal indicative of the values stored in the read address of selected zone 4.210 or 4.211 to the remainder of the data processing system.

Consideration is now given to the operation of the memory system of the present invention.

Selector-starter 1.1 is employed to select which type of cycle, i.e., a useful cycle or a refresh cycle, is to be performed. Selector-starter mutually resynchronizes useful cycle read request signal DC, derived from the remainder of the data processor, or useful cycle write request signal DES, derived from write control generator 1.5, and refresh request signal DRA, derived from refresh generator 3.1, by the structure including flipflops 1.101, 1.108-1.111, AND gates 1.102-1.104, OR gates 1.105 and 1.106, and delay line 1.107. The selected request signal is indicated by the states of flipflops 1.101 and 1.111. Signal C at output terminal 5 of flipflop 1.110 indicates that a useful cycle has been selected by one of signals DC or DES, while signal R at output terminal 5 of flipflop 1.111 indicates that a refresh cycle has been selected by signal DRA. A combination of the states of flipflops 1.110 and 1.111 specifies a ternary selection, as described partially supra, described further infra. Output signals C, $\overline{C}$ and R of flipflops 1.110 and 1.111 are supplied to AND gates 1.112-1.114 to enable cycle management instruction signals to be derived as a function of the selected result.

Consideration will now be given to the three cases of ternary selection which are: (1) refresh selection, (2) useful cycle selection alone, and (3) selection of refresh and useful phases in one cycle; selection of a refresh operation is indicated by signal R having a binary 1 value while signal C has a binary zero value, selection of a useful cycle alone is indicated by signal C having a binary 1 value while signal R has a binary zero value, and simultaneous selection of a refresh phase and a useful phase is indicated by signals C and R both having binary 1 values. A selection phase is invariably accompanied by initiation of a useful cycle implementation phase. Signals S1 and S4, derived from output terminals 5 and 8 of delay line 1.107, respectively trigger flipflops 1.302 and 1.306 of memory energizer 1.3 by enabling these flipflops to be activated into a binary zero state in response to the next transition at clock input terminals 4 of the flipflops. Thereby, technical operations associated with selections of row address signal SAL and of column address signal SAC are consequently initiated in advance, without knowledge of the selection result. The technical operations for selections of row and column address signals SAL and SAC form the first part of an implementation phase of a useful cycle, thereby enabling high speed operation and a reduction of the time required to access data from memory zones 4.210 and 4.211.

In response to the result of the selection phase indicating that a refresh cycle only is to be conducted, the $\overline{C}$ and R signals respectively derived at terminals 6 and 5 of flipflops 1.110 and 1.111 are combined in OR gate 1.114 to derive a signal $\overline{CR}$, whereby the AND gate derives signal $\overline{CR}(S3)$ which is supplied to apparent refresh generator 1.2. In apparent refresh generator 1.2, signal $\overline{CR}(S3)$ triggers monostable 1.201. The trailing edge of the signal at complemented output terminal 4 of monostable 1.201 causes derivation of zero reset signal SALX0, which is applied to clock input terminal 4 of flipflop 1.302 of memory energizer 1.3. Coupling of signal SALX0 to flipflop 1.302 cancels the set state of the flipflop prematurely triggered in response to signal $S_1$, as if a useful cycle had been requested. The time constant of monostable 1.201, FIG. 7, is selected to assure a minimum duration of the technical actions compatible with the utilization of MOS circuits.

Flipflop 1.202 and delay line 1.203 convert the trailing edge of signal SALX0 into signal BR1X1 which initiates derivation of refresh address signals BRZ0 and BRZ1 for memory zones 4.210 and 4.211, respectively; signals BRZ0 and BRZ1 are derived by allocation control generator 1.8. Derivation of row address signals for memory zones 4.210 and 4.211 in response to signals BRZ0 and BRZ1 is performed by the switching action of four channel multiplexers 2.114 and 2.115 in address register 2.1, FIG. 14. Control of multiplexers 2.114 and 2.115, in response to signals BRZ0 and BRZ1, results in preparation of the refresh implementation phase which is subsequently initiated.

After controlling setting of multiplexers 2.114 and 2.115, as described supra, signal SALZ0 is inverted by flipflop 1.212 and delayed by the delay time between input terminal 1 and tap 2 of delay line 1.203, to provide zero resetting of flipflop 1.306, FIG. 8. Zero resetting of flipflop 1.306 cancels the prematurely triggered actions associated with derivation of column address selection signal SAC, as derived at output terminal 5 of flipflop 1.306.

After a further delay and inversion as provided by delay line 1.203 between tap 2 and output terminal 4 and inverter 1.204, signal SALX0 is supplied to input terminal 1 of OR gate 1.205, the output signal of which triggers the refresh phase by supplying of binary 1 level to clock input terminal 4 of flipflop 1.201. Flipflop 1.210 responds to the output signal of OR gate 1.205 by initiating the technical refresh operations in memory zones 4.210 and 4.211 by controlling the derivation of output signals RALZ0 and RALZ1 from AND gates 1.211 and 1.212. The output signal of OR gate 1.205, resulting from derivation of signal SALX0, is also coupled to set input terminal 1 of flipflop 3.117 of refresh energizer 3.1, FIG. 16, to cancel refresh request signal DRA, derived at output terminal 6 of flipflop 3.117.

Apparent refresh generator 1.2, FIG. 7, includes a network formed by monostable 1.206, flipflop 1.207, delay line 1.208, and inverter 1.209 that derive signal FARA, which triggers cycle termination at the end of a cycle period. The trailing edge of the signal of predetermined duration derived from complemented output terminal 4 of monostable 1.206 is converted into a pulse by the circuit including flipflop 1.207 and delay line 1.208. Signal FRA, derived from output terminal 2 of inverter 1.209, in turn responsive to the signal at output terminal 5 of flipflop 1.207, causes the cycle to be ended by triggering cycle terminator 1.7. Cycle terminator 1.7 responds to signal FRA to derive signal SALTZ, which is coupled through OR gate 1.303 and inverted by inverter 1.304, to derive signal SALZ which is applied to input terminal 1 of flipflop 1.210, to reset the flipflop and thereby cancel the refresh cycle. Signal FRA at output terminal 2 of inverter 1.209 resets selector-starter 1.1 for another cycle as a result of derivation of signal VAX1 in response to the derivation of signal FRA. To this end, signal FRA is coupled from inverter 1.209 to OR gate 1.702 and NOR gate 1.703. The output of OR gate 1.702 is supplied to input terminal 1 of AND gate 1.710 by way of tap 8 of delay line 1.705, while input terminal 1 of the AND gate is responsive to the output of NOR gate 1.703 as reflected by the state of flipflop 1.708 at output terminal 5 thereof. AND gate 1.710 responds to the signals at input terminals 1 and 2 thereof to derive signal BAX1.

Consideration is now given to the situation in which flipflop 1.110 of selector-starter 1.1 is at a state wherein signal C is derived at output terminal 5 of the flipflop upon conclusion of the selection phase of a cycle. AND gate 1.113 responds to signal C and signal S3 to derive signal C(S3). Signal C(S3) is supplied as an energizing signal to write controller 1.5 or reader 1.6, or to both of them depending upon the state of signals CYE, CYI and CYL as derived from function register 2.2, FIG. 15. Regardless of the state of CYE, CYI and CYL, a useful cycle is pursued to a satisfactory conclusion, after which another cycle may be initiated.

In response to flipflop 1.111 being in a state whereby signal R has a binary zero value, the memory system executes only a useful cycle. If, however, flipflop 1.111 is activated so that signal R has a binary 1 value, the third case of the ternary selection exists and a refresh cycle is performed, as described infra. However, regardless of the value of signal R, activation of flipflop 1.110 results in completion of a useful cycle implementation phase. The useful cycle implementation phase is started as soon as the cycle begins to secure increases in performances of the cycle and the data access period.

In response to flipflops 1.110 and 1.111 both being activated so that binary 1 levels are derived at output terminals 5 thereof, upon conclusion of the selection phase, a cycle (CR), FIG. 24, that includes the useful cycle and a refresh cycle, is executed in response to derivation of signal S3. Signal S3 enables AND gate 1.112 to derive signal CR(S3) which activates flipflop 1.708 of cycle terminator 1.7 by virtue of the signal being coupled to clock input terminal 1.4 of the flipflop. In response to signal CR(S3), flipflop 1.708 derives binary zero and 1 signals at output terminals 5 and 6 thereof. Consequently, when cycle terminator 1.7 is activated at the end of the useful cycle implementation phase, AND gate 1.710 cannot be enabled to prevent the derivation of restart signal VAX1. Because derivation of restart signal VAX1 is prevented, selector-starter 1.1 cannot be activated to execute another cycle.

Instead, the present cycle is continued in response to AND gate 1.711 being enabled in response to the binary 1 output signal at terminal 6 of flipflop 1.708 and a binary 1 signal from tap 8 of delay lines 1.705, whereby signal LRA is supplied to apparent refresh generator 1.2. Apparent refresh generator 1.2 includes OR gate 1.205 which responds to signal LRA, to trigger implementation of a refresh phase by executing the previously described procedure for implementation of a refresh phase alone in response to signal FRA as derived by monostable 1.206 responding to the output signal of OR gate 1.205 and driving flipflop 1.207 and inverter 1.209. Prior to implementation of the refresh action in response to the output signal of OR gate 1.205, address input terminals 2–8 of memory zones 4.210 or 4.211 have been connected to be responsive to signals indicative of the refresh addresses, as a result of a binary 1 value for signal BR2X1 being derived by AND gate 1.709, in turn responsive to a binary 1 level at output terminal 6 of flipflop 1.708 and a binary 1 signal at tap 7 of delay line 1.705.

When the refresh cycle has been completely implemented, signal FRA, derived from inverter 1.209 (FIG. 7), is coupled as an enabling input to cycle terminator 1.7. Signal FRA is coupled through NOR gate 1.703 to set input terminal 1 of flipflop 1.708 whereby binary 1 and zero levels are derived at output terminals 5 and 6 thereof. The binary 1 signal at output terminal 5 of flipflop 1.708 enables restart signal VAX1 to be derived, to complete the composite cycle (C,R) by preparing selector-starter 1.1 for another cycle. During this second pass of signal FRA through cycle terminator 1.7, signals BR2X1 and LRA are not derived because output terminal 6 of flip 1.708 is at a binary zero level which prevents enabling of AND gates 1.709 and 1.711 from which signals BR2X1 and LRA are derived. Thereby, the useful and refresh phases are executed during the same cycle, to minimize the time requirements for a refresh operation.

From the foregoing, the useful phase always occurs at the beginning of the cycle with the resulting salutary consequences for the data access period. In contrast, a refresh request never has to wait longer than the execution period of a useful phase, which is of equal importance from the point of view of technical limitations. It is apparent from the preceding description of a preferred embodiment of the invention that the performance factors of a dynamic MOS, random access memory are substantially improved with respect to operating speed and data accessibility while retaining all of the normal technical conditions of a conventional memory of this type.

While there have been described and illustrated several specific embodiments of the invention, it will be clear that variations in the details of the embodiments specifically illustrated and described may be made without departing from the true spirit and scope of the invention as defined in the appended claims.

I claim:

1. A method of refreshing a random access memory requiring refreshing, said memory writing data signals from a data processor into specified memory addresses and reading data signals from the data processor from specified memory addresses during useful phases of operating cycles of the memory, the memory being refreshed during refresh phases of operating cycles of the memory, comprising initiating a selection phase concurrently with a useful phase at the beginning of each cycle, during the selection phase determining if the memory is to enter a refresh phase during the cycle, and initiating the refresh phase during the cycle in response to the determination during the selection phase indicating that the memory is to enter the refresh phase.

2. The method of claim 1 wherein the useful phase is stopped after completion of the selection phase in response to the selection phase indicating that the refresh phase is to be initiated and the refresh phase is started after the useful phase is stopped.

3. The method of claim 2 wherein the useful phase is not completely executed upon completion of the selection phase and is stopped substantially simultaneously with the selection phase being completed.

4. The method of claim 2 wherein the useful phase is completely executed after completion of the selection phase regardless of the indication made during the selection phase and the refresh phase is executed after the useful phase has been completely executed during cycles that the selection phase indicates a refresh phase is to be executed.

5. The method of claim 2 wherein, during the selection phases when it is determined that the memory is to be refreshed during the cycle, determining whether the memory is to be refreshed during the cycle in a first or a second mode; in response to the first mode being determined: stopping the useful phase after completion of the selection phase without completing the useful phase and starting the refresh phase as the useful phase is stopped; in response to the second mode being determined: completely executing the useful phase after completion of the selection phase and starting the refresh phase as the useful phase is being completed.

6. The method of claim 1 wherein all of the recited steps are executed for the same specified address during a single cycle.

7. A method of refreshing a random access memory requiring periodic refreshing, said memory writing data signals from a data processor into specified memory addresses and reading data signals into the data processor from specified memory addresses during useful phases of operating cycles of the memory, the memory being refreshed during refresh phases of operating cycles of the memory, comprising initiating a selection phase concurrently with a useful phase at the beginning of each cycle, during the selection phase determining if the memory is to enter a refresh phase during the cycle, in response to the determination during the selection phase indicating that the memory is to enter the refresh phase completing execution of the useful phase and thereafter initiating the refresh phase.

8. The method of claim 7 wherein all of the recited steps are executed for the same specified address during a single cycle.

9. A method of refreshing a random access memory requiring refreshing, said memory writing data signals from a data processor into specified memory addresses and reading data signals into the data processor into memory addresses during useful phases of operating cycles of the memory, the memory being refreshed during refresh phases of operating cycles of the memory, comprising initiating a selection phase concurrently with a useful phase at the beginning of each cycle, during the selection phase determining if the memory is to enter a refresh phase during the cycle, in response to the determination during the selection phase indicating that the memory is to enter the refresh phase terminating the useful phase and thereafter initiating the refresh phase, in response to the determination during the selection phase indicating that the memory is not to enter the refresh phase continuing the execution of the useful phase without executing the refresh phase.

10. The method of claim 9 wherein all of the recited steps are executed for the same specified address during a single cycle.

11. Apparatus for refreshing a random access memory requiring refreshing, said memory writing data signals from a data processor into specified memory addresses and reading data signals into the data processor from specified memory addresses during useful phases of operating cycles of the memory, the memory being refreshed during refresh phases of operating cycles of the memory, comprising first means for initiating a selection phase concurrently with a useful phase at the beginning of each cycle, means operative during the selection phase for determining if the memory is to enter a refresh phase during the cycle, and second means responsive to the determination made during the selection phase indicating that the memory is to enter the refresh phase for initiating the refresh phase during the cycle.

12. The apparatus of claim 11 further including means for stopping the useful phase after completion of the selection phase in response to the selection phase indicating that the refresh phase is to be initiated and for starting the refresh phase after the useful phase has stopped.

13. The apparatus of claim 12 further including means for preventing complete execution of the useful phase in response to the selection phase being completed and indicating that the refresh phase is to be executed and for starting the refresh phase as the useful phase is stopped.

14. The apparatus of claim 12 further including means for completely executing the useful phase regardless of the determination being made during the selection phase and for commanding execution of a refresh phase during the cycle after completion of the useful phase only in response to the selection phase determining that a refresh phase has been requested.

15. The apparatus of claim 11 wherein the means for determining includes means for indicating that the memory is: (a) not to be refreshed during the cycle, (b) to be refreshed during the cycle in accordance with a first mode, and (c) to be refreshed during the cycle in accordance with a second mode; means responsive to indication (a) for executing a useful cycle and for preventing operation of the means for initiating the refresh phase during the cycle, and means responsive to indication (b) for stopping the useful phase after completion of the selection phase without completing the useful phase and starting the refresh phase as the useful phase is stopped, and responsive to indication (c) for completely executing the useful phase after completion of the selection phase and starting the refresh phase as the useful phase is being completed.

16. The apparatus of claim 11 wherein the first means for initiating includes means for initiating the selection phase and the useful phase for a specified address during a single cycle, the means for determining includes means for determining that the specified address is to be refreshed during the single cycle, and the second means for initiating initiates the refresh phase for the specified address during the single cycle.

17. Apparatus for refreshing a random access memory requiring refreshing, said memory writing data signals from a data processor into specified memory addresses and reading data signals into the data processor from specified memory addresses during useful phases of operating cycles of the memory, the memory being refreshed during refresh phases of operating cycles of the memory, comprising means for initiating a selection phase concurrently with a useful phase at the beginning of each cycle, means operative during the selection phase for determining if the memory is to enter a refresh phase during the cycle, and means responsive to the determination during the selection phase indicating that the memory is to enter the refresh phase for completing execution of the useful phase and for thereafter initiating the refresh phase.

18. The apparatus of claim 17 wherein means for initiating includes means for initiating the selection phase and the useful phase for a specified address during a single cycle, the means for determining includes means for determining that the specified address is to be refreshed during the single cycle, and the means for completing and initiating includes means for completing execution of the useful phase for the specified address during the single cycle and for thereafter initiating the refresh phase for the specified address during the single cycle.

19. Apparatus for refreshing a random access memory requiring refreshing, said memory writing data signals from a data processor into specified memory addresses and reading data signals into the data processor from specified memory addresses during useful phases of operating cycles of the memory, the memory being refreshed during refresh phases of operating cycles of the memory, comprising means for initiating a selection phase concurrently with a useful phase at the beginning of each cycle, means operative during the selection phase for determining if the memory is to enter a refresh phase during the cycle, means responsive to the determination during the selection phase indicating that the memory is to enter the refresh phase for terminating the useful phase and for thereafter initiating the refresh phase, and means responsive to the determination during the selection phase indicating that the memory is not to enter the refresh phase for continuing execution of the useful phase without execution of the refresh phase.

20. The apparatus of claim 19 wherein the means for initiating includes means for initiating the selection phase and the useful phase for a specified address during a single cycle, the means for determining includes means for determining that the specified address is to be refreshed during the single cycle, and the means for terminating and thereafter initiating includes means for terminating the useful phase for the specified address during the single cycle and for thereafter initiating the refresh phase for the specified address during the single cycle, and the means for continuing includes means for continuing execution of the useful phase for the specified address during the single cycle.

21. Apparatus for addressing and refreshing a random access memory requiring refreshing in response to signals commanding data to be read from and written into specified addresses of the memory and commanding the refreshing, said commanding signals being derived from the remainder of a data processing system of which the memory is a part, the memory comprising means for writing data signals from the remainder of the data processing system into the specified memory addresses and reading data signals into the data processor from the specified memory addresses during useful phases of operating cycles of the memory, first means responsive to command signals from the remainder of the data processing system for initiating a selection phase concurrently with a useful phase at the beginning of each cycle, means operative during the selection phase and responsive to the command signals for determining if the memory is to enter a refresh phase during the cycle, second means responsive to the determination made during the selection phase indicating that the memory is to enter the refresh phase for initiating the refresh phase during the cycle, and means for supplying refresh signals to the memory addresses during the refresh phase.

22. The apparatus of claim 21 further including means for stopping the useful phase after completion of the selection phase in response to the selection phase indicating that the refresh phase is to be initiated and for starting the refresh phase after the useful phase is stopped.

23. The apparatus of claim 22 further including means for preventing complete execution of the useful phase in response to the selection phase being completed and indicating that the refresh phase is to be executed and for starting the refresh phase as the useful phase is stopped.

24. The apparatus of claim 22 further including means for completely executing the useful phase regardless of the determination made during the selection phase and for commanding execution of a refresh phase during the cycle after completion of the useful phase only in response to the selection phase determining that a refresh phase has been requested.

25. The apparatus of claim 21 wherein the first means for initiating includes means for initiating the selection phase and the useful phase for a specified address during a single cycle, the means for determining includes means for determining that the specified address is to be refreshed during the single cycle, the second means for initiating initiates the refresh phase for the specified address during the single cycle, and the means for supplying includes means for supplying refresh signals to the specified memory address during the single cycle.

* * * * *